United States Patent
Eguchi et al.

(10) Patent No.: US 7,746,718 B2
(45) Date of Patent: Jun. 29, 2010

(54) SEMICONDUCTOR MEMORY, OPERATING METHOD OF SEMICONDUCTOR MEMORY, MEMORY CONTROLLER, AND SYSTEM

(75) Inventors: Yasuyuki Eguchi, Kawasaki (JP); Shinya Fujioka, Kawasaki (JP); Yoshiaki Okuyama, Kirishima (JP)

(73) Assignee: Fujitsu Semiconductor Limited, Yokohama (JP)

( * ) Notice: Subject to any disclaimer, the term of this patent is extended or adjusted under 35 U.S.C. 154(b) by 53 days.

(21) Appl. No.: 11/998,428

(22) Filed: Nov. 30, 2007

(65) Prior Publication Data

US 2008/0144417 A1 Jun. 19, 2008

(30) Foreign Application Priority Data

Dec. 15, 2006 (JP) ............................. 2006-338336

(51) Int. Cl.
*G11C 7/00* (2006.01)
(52) U.S. Cl. ................ 365/222; 365/230.03; 365/233.1; 365/189.05
(58) Field of Classification Search ................. 365/222, 365/230.03, 233.1, 189.05, 236
See application file for complete search history.

(56) References Cited

U.S. PATENT DOCUMENTS 7,180,808 B2 * 2/2007 Choi et al. ................... 365/222
7,342,841 B2 * 3/2008 Jain et al. .................... 365/222

2004/0165465 A1 8/2004 Kashiwazaki

FOREIGN PATENT DOCUMENTS

| JP | 09-128965 A | 5/1997 |
|---|---|---|
| JP | 2002-190724 A | 7/2002 |
| JP | 2002-269981 A | 9/2002 |
| JP | 2003-068075 A | 3/2003 |
| JP | 2004-259343 A | 9/2004 |

* cited by examiner

*Primary Examiner*—David Lam
(74) *Attorney, Agent, or Firm*—Arent Fox LLP

(57) ABSTRACT

A refresh register stores disable block information indicating a memory block whose refresh operation is to be disabled. A refresh control circuit periodically executes the refresh operation of a memory block except the memory block corresponding to the disable block information. During an access cycle to one of the memory blocks, the register control circuit writes the disable block information to the refresh register according to an external input. Consequently, in order to rewrite the refresh register, it is not necessary to use an additional operation cycle to the access cycle. Since there is no need to insert an extra operation cycle, it is possible to change a memory area to be refreshed without lowering effective efficiency of access cycles. As a result, power consumption can be reduced.

18 Claims, 32 Drawing Sheets

US 7,746,718 B2

SEMICONDUCTOR MEMORY, OPERATING METHOD OF SEMICONDUCTOR MEMORY, MEMORY CONTROLLER, AND SYSTEM

CROSS REFERENCE TO RELATED APPLICATION

This application is based upon and claims the benefit of priority from Japanese Patent Application No. 2006-338336, filed on Dec. 15, 2006, the entire contents of which are incorporated herein by reference.

BACKGROUND

1. Field

The embodiments relate to a semiconductor memory having dynamic memory cells, a memory controller, and a system.

2. Description of the Related Art

In recent years, portable equipments operating by using batteries, such as mobile phones, have come into wide use. Low power consumption is required of semiconductor memories mounted in these portable equipments in order to allow long-term use of the batteries. Further, recent portable equipments often handle a large volume of data such as images and music files. Therefore, these portable equipments demand for DRAMs with large density and low-power consumption.

To reduce standby power consumption, a DRAM having a partial self-refresh mode is being developed (for example, Japanese Unexamined Patent Application Publication No. 2003-68075 and Japanese Unexamined Patent Application Publication No. 2002-269981). A DRAM of this type executes a refresh operation only in part of memory areas during a self-refresh mode in order to reduce power consumption.

The memory area whose refresh operation is to be executed during the self-refresh mode is set according to, for example, an address signal supplied with an entry command of the self-refresh mode. Instead the memory area whose refresh operation is to be executed is set according to an address signal supplied with a mode register set command.

Meanwhile, systems such as portable equipments require multi controllers in order to improve system functions. In this case, a semiconductor memory is accessed by the plural controllers. Memory areas accessed by the controllers is changed depending on an operation state of the system equipment. It is possible to reduce power consumption of the semiconductor memory by disabling a refresh operation of a memory area not in use according to the operation state of the system equipment. However, the setting of a mode register or the self-refresh mode is executed exclusively from memory access, and therefore, a memory area whose refresh operation is to be executed has to be changed between memory access cycles by the mode register set command or the like. Therefore, as the memory area change is performed frequently, effective efficiency of memory access becomes lower, which result in lower system performance. In case that a system equipment cannot tolerate the deterioration in access efficiency, since the memory area change is not allowed, a refresh operation is executed to a memory area where refresh operation is essentially unnecessary, and thus power consumption cannot be reduced.

SUMMARY

The embodiment provides that a semiconductor memory including a plurality of memory blocks each having dynamic memory cells, a refresh register storing disable block information indicating a memory block whose refresh operation is to be disabled, a refresh control circuit periodically executing the refresh operation of a memory block except the memory block corresponding to the disable block information stored in the refresh register and a register control circuit writing the disable block information to the refresh register according to an external input, during an access cycle to one of the memory blocks.

DETAILED DESCRIPTION OF THE EMBODIMENTS

Figure 1:
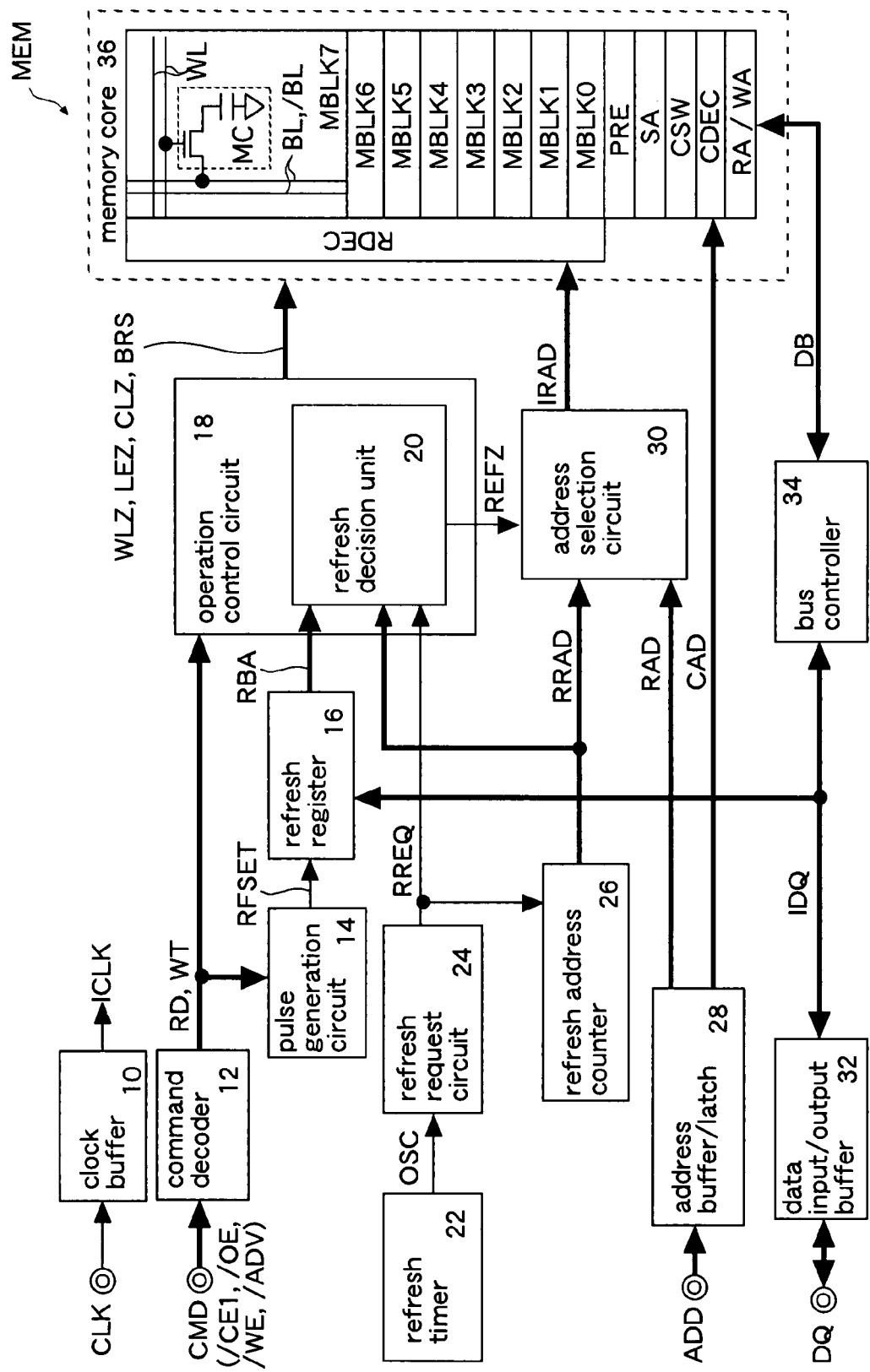
FIG. 1 is a block diagram showing a semiconductor memory of a first embodiment.

Hereinafter, embodiments will be described, using the drawings. In the drawings, each signal line shown by the heavy line is constituted of a plurality of lines. Some of blocks to which the heavy lines are coupled is constituted of a plurality of circuits. Each signal line through which the signal is transmitted is denoted by the same reference symbol as the signal name. Each signal starting with "/" represents negative logic. Each signal ending with "Z" represents positive logic. Each double circle in the drawings represents an external terminal.

FIG. 1 shows a semiconductor memory MEM of a first embodiment. The semiconductor memory MEM is, for example, a clock synchronous type FCRAM (Fast Cycle RAM) operating in synchronization with an external clock CLK. The FCRAM is a pseudo SRAM having memory cells of a DRAM and an interface of a SRAM and capable of automatically executing a refresh operation in a chip.

Figure 2:
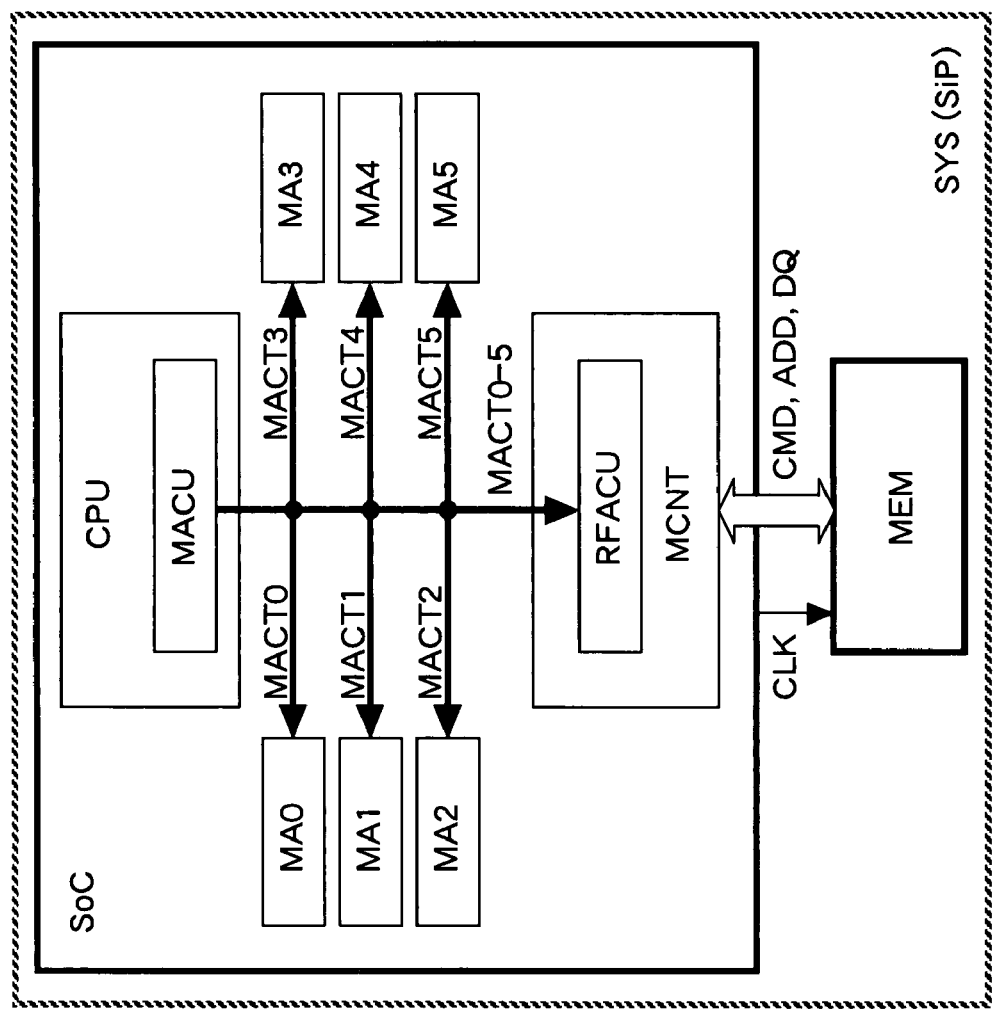
FIG. 2 is a block diagram showing a system of the first embodiment.

The memory MEM has a clock buffer 10, a command decoder 12, a pulse generation circuit 14, a refresh register 16, an operation control circuit 18 having a refresh decision unit 20, a refresh timer 22, a refresh request circuit 24, a refresh address counter 26, an address buffer/latch 28, an address selection circuit 30, a data input/output buffer 32, a bus controller 34, and a memory core 36. The memory MEM and a CPU constitute a system SYS as shown in FIG. 2.

As an internal clock signal ICLK, the clock buffer 10 supplies a clock signal CLK received at a clock terminal to each circuit block. Each of the circuit blocks operates in synchronization with the internal clock signal ICLK. The generation of the internal clock signal ICLK may be stopped according to level of a not-shown clock enable signal CKE supplied to the clock buffer 10. In a case where the internal clock signal ICLK is not output (in a case where the clock enable signal CKE has inactive level), a refresh operation of part of memory cells MC is stopped and an operation mode of the memory MEM shifts to a power-down mode in which data of at least part of the memory cells MC is not maintained, or to a self-refresh mode.

Upon logic level of a command signal CMD, the command decoder 12 outputs a read command signal RD or a write command signal WT in order to execute an access operation of the memory core 36. The read command signal RD and the write command signal WT are external access requests for the execution of the access operation of the memory core 36. For example, the command signal CMD includes a chip enable signal /CE1, an output enable signal /OE, a write enable signal /WE, and an address valid signal /ADV.

The pulse generation circuit 14 outputs an area set signal RFSET in response to an access command (the read command signal RD or the write command signal WT). In synchronization with the area set signal RFSET, the refresh register 16 holds a data signal DQ (IDQ) supplied via a data terminal DQ, and outputs the held signal as a refresh block address signal RBA. The refresh block address signal RBA is disable block information indicating a memory block MBLK whose refresh operation is to be disabled, out of memory blocks MBLK0-7. In other words, the refresh block address signal RBA indicates a memory block MBLK whose refresh operation is to be executed.

In response to the read command signal RD, the write command signal WT, or a refresh request signal RREQ, the operation control circuit 18 outputs a word line activation signal WLZ, a sense amplifier activation signal LEZ, a column selection signal CLZ, and a precharge control signal BRS which are for causing the memory core 36 to execute a read operation, a write operation, or a refresh operation. The word line activation signal WLZ controls an activation timing of a word line WL, and the sense amplifier activation signal LEZ controls an activation timing of a sense amplifier SA. The column selection signal CLZ controls an on/off timing of a column switch CSW, and the precharge control signal BRS controls an on/off timing of a precharge circuit PRE.

The refresh decision unit 20 of the operation control circuit 18 operates as an arbiter deciding the priority sequence of the read command RD/write command VT and the refresh request RREQ. For example, the refresh decision unit 20 gives priority to the refresh request RREQ when the read command RD and the refresh request RREQ are simultaneously received. A read operation in response to the read command RD is suspended until the refresh operation in response to the refresh request RREQ is completed. On the other hand, when the refresh request RREQ is supplied during a read operation, a refresh operation in response to the refresh request RREQ is suspended until the read operation is completed. The same priority rule also applies to the write command WT. The refresh decision unit 20 activates a refresh signal REFZ when the refresh operation is to be executed. However, when a refresh address signal RRAD indicates the memory block MBLK whose refresh operation is to be disabled as indicated by the refresh block address signal RBA, the refresh decision unit 20 disables the refresh operation and does not activate the refresh signal REFZ. The operation control circuit 18 executes the refresh operation in synchronization with the activation of the refresh signal REFZ. Therefore, when the refresh signal REFZ is inactive, the refresh operation in response to the refresh request signal RREQ is not executed.

The refresh timer 22 has an oscillator outputting an oscillating signal OSC at a predetermined cycle. The refresh request circuit 24 divides a frequency of the oscillating signal OSC to generate the refresh request signal RREQ (internal access request). The refresh address counter 26 sequentially generates the refresh address signal RRAD in synchronization with the refresh request signal RREQ. The refresh decision unit 20, the refresh timer 22, the refresh request circuit 24, and the refresh address counter 26 operate as a refresh control circuit which periodically executes the refresh operation of the memory blocks MBLK except the memory block(s) MBLK corresponding to the disable block information RBA stored in the refresh register 16.

The refresh address signal RRAD is an address signal for selecting a memory block MBLK and a word line WL and has the same number of bits as that of a row address signal RAD. Low-order bits of the refresh address signal RRAD are allocated for the selection of a memory block MBLK. High-order bits of the refresh address signal RRAD are allocated for the selection of a word line WL. Therefore, the refresh operation is firstly executed in each of the memory blocks MBLK0-7 in sequence every time the refresh request signal RREQ is generated, and after the refresh operation is executed once in each of the memory blocks MBLK0-7, a word line WL selected for the refresh operation is changed.

The address buffer/latch 28 receives an address signal ADD and outputs the received address as a row address signal RAD and a column address signal CAD. The column address signal CAD is supplied for the selection of bit lines BL, /BL. The address selection circuit 30 selects the refresh address signal RRAD when the refresh operation is to be executed (REFZ=high level), while selecting the row address signal RAD when the refresh operation is not to be executed (REFZ=low level), and outputs the selected signal as an internal row address signal IRAD to the memory core 36.

The data input/output buffer 32 receives a write data signal via the data terminal DQ and outputs the received data signal as an internal data signal IDQ. Further, the data input/output buffer 32 receives a read data signal output from the memory cell MC and outputs the received data signal to the data terminal DQ. In a write operation, the bus controller 34 converts the serial internal data signal IDQ (write data) to parallel data and outputs the parallel data to a data bus DB. In a read operation, the bus controller 34 converts parallel read data on the data bus DB to serial data and outputs the serial data as an internal data signal IDQ. A bit width of the data bus DB is, for example, twice as wide as a bit width of the data terminal DQ.

The memory core 36 has the eight memory blocks MBLK0-7 (MBLK) equal in memory capacity, a row decoder RDEC, the precharge circuit PRE, the sense amplifier SA, the column switch CSW, a column decoder CDEC, a read amplifier RA, and a write amplifiers WA which are common to the memory blocks MBLK0-7. Each of the memory blocks MBLK0-7 has a plurality of dynamic memory cells MC, word lines WL each coupled to the memory cells MC arranged in line in one direction, and bit lines BL, /BL each coupled to the memory cells MC arranged in line in a direction perpendicular to the one direction. In this example, the bit lines BL, /BL are wired in common to the memory blocks MBLK0-7. Each of the memory cells MC has a capacitor for holding data as electric charge and a transfer transistor for coupling one end of the capacitor to the bit line BL (or /BL). The other end of the capacitor is coupled to a precharge voltage line VPR. A gate of the transfer transistor is coupled to the word line WL. In response to the selection of the word line WL, one of a read operation, a write operation, and a refresh operation is executed.

The row address decoder RDEC decodes the internal row address signal IRAD in order to select one of the word lines WL. The precharge circuit PRE couples the bit lines BL, /BL to the precharge voltage line VPR in synchronization with the precharge control signal BRS when the memory cell MC is not accessed. The sense amplifier SA amplifiers a signal level difference between data signals read to the bit line pair BL, /BL. The column address decoder CDEC decodes the column address signal CAD in order to select the bit line pair BL, /BL to/from which the data signal is to be input/output. The column switch CSW couples the bit lines BL, /BL corresponding to the column address signal CAD to the read amplifier RA and the write amplifier WA. In a read access operation, the read amplifier RA amplifies complementary read data output via the column switch CSW. In a write access operation, the write amplifier WA amplifiers complementary write data supplied via the data bus DB and supplies the resultant write data to the bit line pair BL, /BL.

FIG. 2 shows a system SYS of the first embodiment. The system SYS includes a SoC (System on Chip) and the memory MEM shown in FIG. 1. The system SYS is configured, for example, as a SiP (System in Package) in which the SoC and the memory MEM are bonded together by using a CoC (Chip on Chip) technique. Incidentally, the system SYS may be configured such that the SoC and the memory MEM are mounted on a system board such as a flexible printed-circuit board.

The SoC has a CPU, six master controllers MA0-5 (MA), and a memory controller MCNT. The CPU has a master control unit MACU controlling bus rights and so on of the master controllers MA0-5 and controls the whole system SYS. The CPU also operates as a kind of a master controller. The master control unit MACU outputs master control signals MACT0-5 (MACT) to the master controllers MA0-5 according to an operation state of the system SYS. For example, each of the master control signals MACT0-5 includes a master selection signal (chip select signal) permitting the operation of the corresponding one of the master controllers MA0-5, a low-power signal setting the corresponding one of the master controllers MA0-5 to a low-power state, and a clock signal.

Each of the master controllers MA0-5 is, for example a DSP, a DMAC, an external interface control circuit, a macro realizing part of the system operation, or the like, and accesses the memory MEM in order to temporarily store work data or the like. Each of the master controllers MA0-5 outputs a command signal SCMD and an address signal SADD shown in FIG. 3 when accessing the memory MEM. Each of the master controllers MA0-5 outputs a data signal SDQ (FIG. 3) to the memory controller MCNT in a write access operation, and receives a data signal SDQ from the memory controller MCNT in a read access operation. For this purpose, a system bus (not shown) including a command signal line SCMD, an address signal line SADD, and a data signal line SDQ is wired to couple the CPU, the master controllers MA0-5, and the memory controller MCNT.

In response to an access request supplied from the CPU and the master controllers MA0-5 via the system bus, the memory controller MCNT outputs the command signal CMD and the address signal ADD in order to access the memory MEM and receives/outputs the data signal DQ. The memory controller MCNT has a refresh area control unit RFACU. The refresh area control unit RFACU calculates a memory block MBLK that is possibly accessed, according to the master control signals MACT0-5 for example master selection signal. The refresh area control unit RFACU will be described in detail in FIG. 3. For example, the clock signal CLK may be generated in the SoC, or may be generated by an external oscillator. Incidentally, in a case where the memory MEM is also accessed by the CPU, a master selection signal (not shown) from the CPU in addition to the master control signals MACT0-5 (master selection signals) is supplied to the memory controller MCNT.

Figure 3:
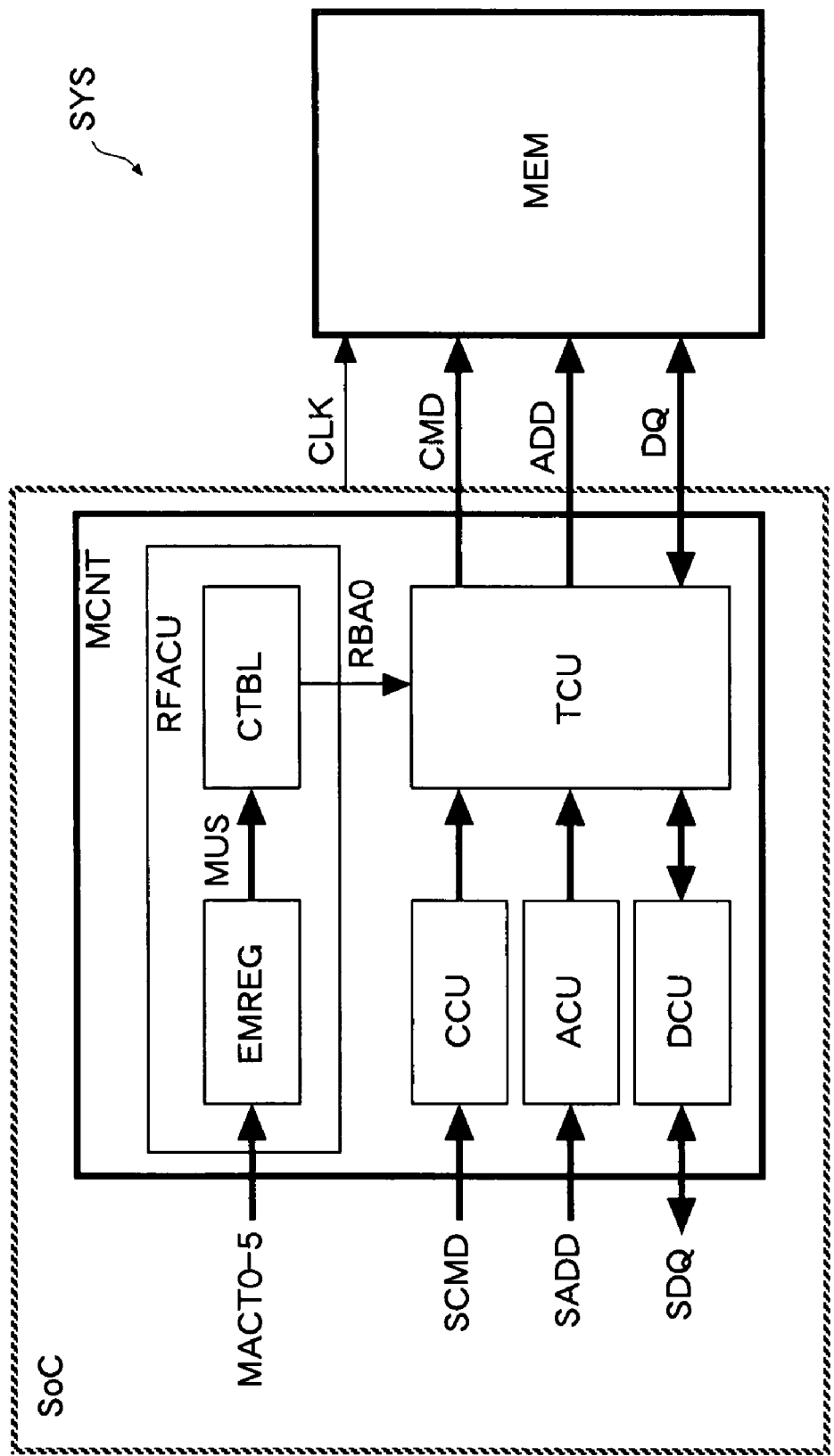
FIG. 3 is a block diagram showing details of a memory controller shown in FIG. 2.
Figure 5:
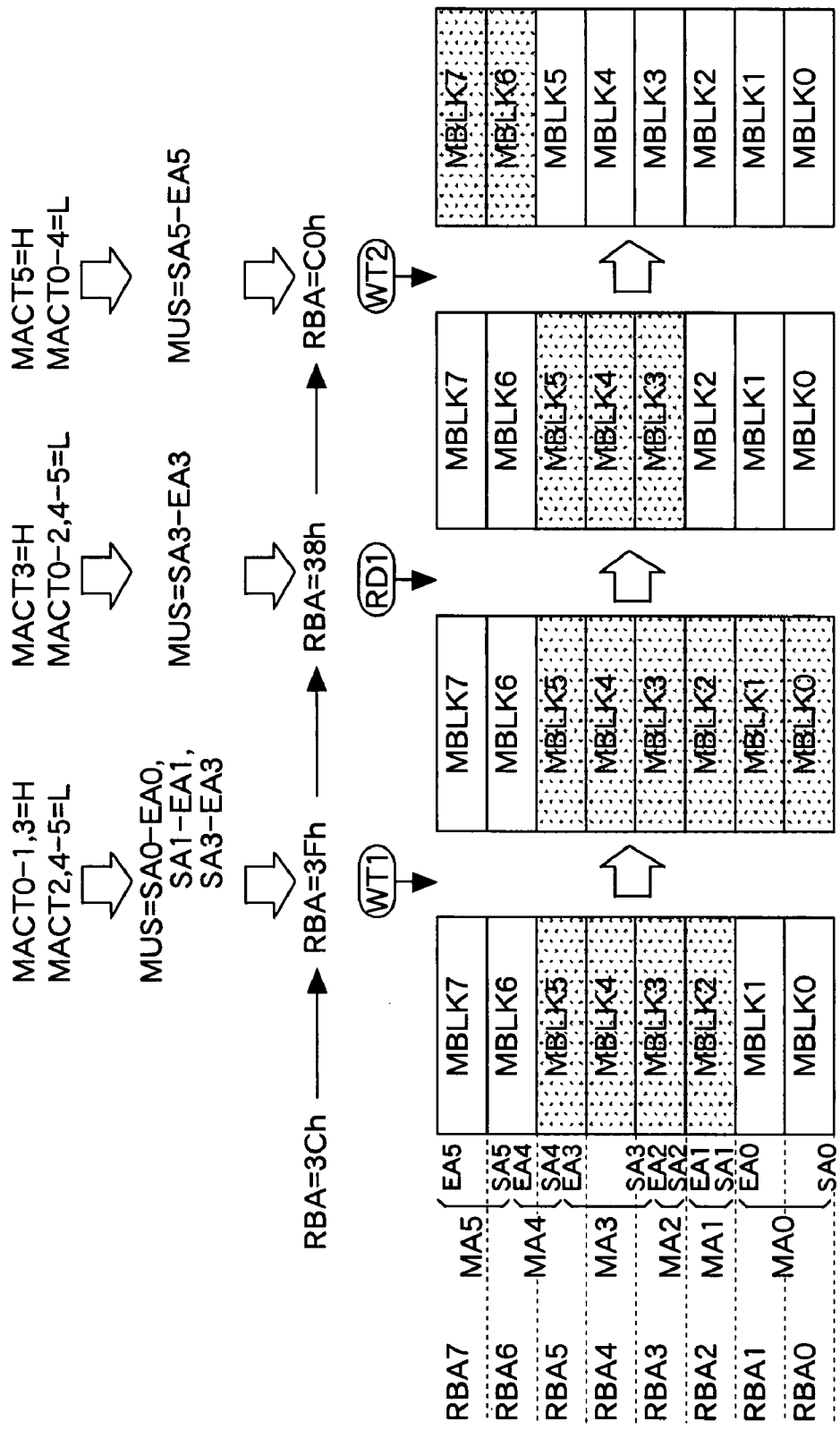
FIG. 5 is an explanatory chart showing a refresh area change in the first embodiment.

FIG. 3 shows details of the memory controller MCNT shown in FIG. 2. The memory controller MCNT has, in addition to the refresh area control unit RFACU, a command control unit CCU, an address control unit ACU, a data control unit DCU, a timing control unit TCU. The refresh area control unit RFACU has an external memory area register EMREG and a conversion table CTBL. The external memory area register EMREG stores in advance memory areas that the respective master controllers MA0-5 assign in the memory MEM. The memory areas assigned by the respective master controllers MA0-5 are decided in advance by the system specification. Based on input of the master control signals MACT0-5 (master selection signals), the external memory area register EMREG calculates the use area(s) of the memory MEM to output a use area signal MUS. The use area signal MUS indicates the memory area of the memory MEM used by each master controller MA permitted to operate, as shown in FIG. 5 to be described later.

The conversion table CTBL outputs to the timing control unit TCU a refresh block address signal RBA0 indicating the memory block(s) MBLK corresponding to the use area signal MUS. The refresh block address signal RBA0 indicates the memory block(s) MBLK to be used and also indicates the memory block(s) MBLK whose refresh operation is to be disabled. Thus, the refresh area control unit RFACU generates disable block information (RBA0) according to the memory area(s) of the memory MEM used by the master controllers MA0-5. The conversion table CTBL operates as an area conversion unit which generates, according to the use area signal MUS, the disable block information (RBA0) indicating the memory block(s) MBLK except the memory block (s) MBLK including the memory area(s) indicated by the use area signal MUS. Incidentally, the conversion table CTBL may be configured as a memory circuit or as a logic circuit.

The command control unit CCU, the address control unit ACU, and the data control unit DCU receive the command signal SCMD, the address signal SADD, and the data signal SDQ (write data) which are supplied via the system bus, and output the received signals to the timing control unit TCU. Further, the data-control unit DCU outputs, as the data signal SDQ, the data signal (read data) which is supplied via the timing control unit TCU from the memory MEM. Incidentally, the command control unit CCU, the address control unit ACU, and the data control unit DCU may have a function of converting the access request signals (SCMD signals and so forth) received from the master controllers MA0-5 to signals accessible to the memory MEM. The timing control unit TCU adjusts the timings of the access signals from the command control unit CCU, the address control unit ACU, and the data control unit DCU to the timing at which the memory MEM is accessible, and outputs the resultant signals as the command signal CMD, the address signal ADD, and the write data signal DQ. The timing control unit TCU adjusts the timing of the read data signal DQ output from the memory MEM based on the specification of the system bus and outputs the resultant data signal DQ to the data control unit DCU. Further, the timing control unit TCU outputs to the memory MEM the refresh block address signal RBA0 (disable block information), which is output from the refresh area control unit RFACU, as a data signal DQ (write data) during a period in which the refresh block address signal RBA0 does not compete with the data signals SDQ output from the master controllers MA0-5.

Figure 4:
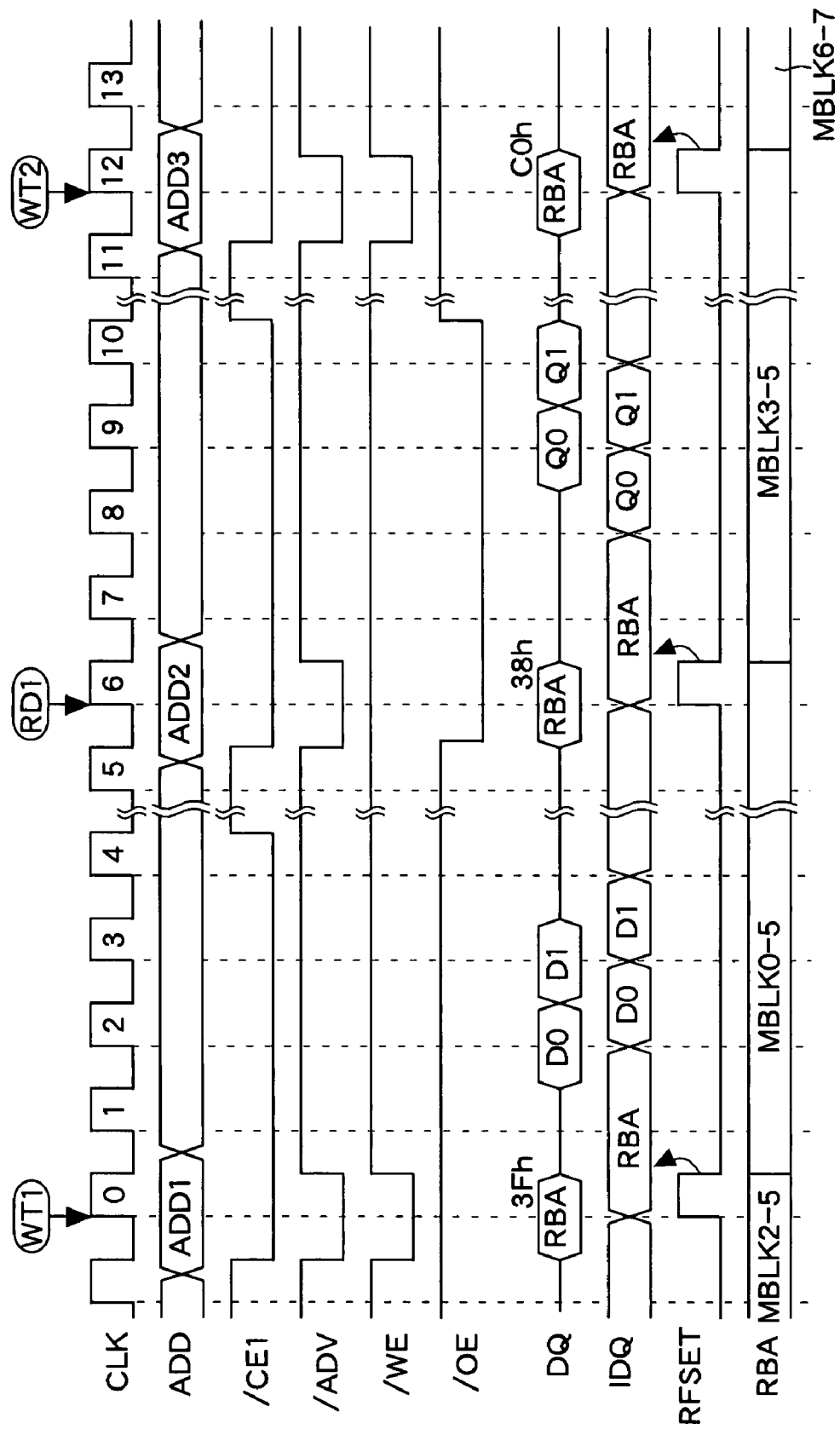
FIG. 4 is a timing chart showing operations of the semiconductor memory of the first embodiment.

FIG. 4 shows operations of the semiconductor memory MEM of the first embodiment. In this example, access command signals (a write command WT1, a read command RD1, and a write command WT2=external access requests) are sequentially supplied to the memory MEM from the memory controller MCNT in synchronization with rising edges of the clock signal CLK. The write commands WT1, WT2 are recognized based on low level of the /CE1 signal and the /WE signal and high level of the /OE signal. The read command RD1 is recognized based on low level of the /CE1 signal and the /OE signal and high level of the /WE signal.

The memory controller MCNT changes /ADV signal indicating that an address terminal ADD is valid to low level together with the access command signal, and outputs the address signal ADD to the address terminal ADD. The memory controller MCNT sequentially outputs write data signals D0, D1 to the data terminal DQ two clocks later after the supply of the write commands WT1, WT2 (write data latency=2, write burst length=2). The memory MEM sequentially outputs read data signals Q0, Q1 to the data terminal DQ three clocks later after the supply of the read command RD1 (read data latency=3, read burst length=2).

The write data latency is the number of clock cycles from the receipt of the write command WT up to the receipt of the first write data D1. The read data latency is the number of clock cycles from the receipt of the read command RD up to the output of the first read data Q1. The burst length is the number of times data is received at the data terminal DQ in response to the one write command WT, and the number of times data is output from the data terminal DQ in response to the one read command RD. The data latency is set by a not-shown mode register (or a configuration register) according to the frequency of the clock signal CLK. The burst length is settable by the mode register (or the configuration register) to one of 1, 2, 4, 8, and full burst.

Further, in this embodiment, the memory controller MCNT outputs the 8-bit refresh block address signal RBA to the data terminal DQ in synchronization with rising edges of the clock signal CLK at which the access command signals are received. The pulse generation circuit 14 in FIG. 1 outputs the area set signal RFSET in synchronization with the access commands. In synchronization with, for example, falling edges of the area set signal RFSET, the refresh register 16 holds the refresh block address signal RBA through an internal data signal line IDQ come from the data input/output buffer 32 and outputs the held refresh block address signal RBA to the refresh decision unit 20.

Values of the refresh block address signal RBA held in the refresh register 16 correspond to the memory blocks MBLK0-7 in order from low-order bits to high-order bits. A bit whose value is "1" indicates that the refresh operation is executed and data of the corresponding memory block MBLK is maintained. A bit whose value is "0" indicates that the refresh operation is disabled and data of the corresponding memory block MBLK is not maintained.

The refresh register 16 holds a refresh block address value of 3c (8 bits) in hexadecimal before the write command WT1 is supplied. At this time, the refresh operation of the memory blocks MBLK2-5 is executed in synchronization with the refresh request signal RREQ, but the refresh operation of the memory blocks MBLK0-1, 6-7 is disabled. The refresh register 16 holds the refresh block address signal RBA (3F in hexadecimal) in synchronization with a falling edge of the area set signal RFSET. At this time, the refresh operation of the memory blocks MBLK0-5 is executed in synchronization with the refresh request signal RREQ, but the refresh operation of the memory blocks MBLK6-7 is disabled.

Similarly, the refresh register 16 holds the refresh block address signal RBA (38 in hexadecimal) supplied in synchronization with the read command RD1. At this time, the refresh operation of the memory blocks MBLK3-5 is executed in synchronization with the refresh request signal RREQ, but the refresh operation of the memory blocks MBLK0-2, 6-7 is disabled. Further, the refresh register 16 holds the refresh block address signal RBA (C0 in hexadecimal) supplied in synchronization with the write command WT2. At this time, the refresh operation of the memory blocks MBLK6-7 is executed in synchronization with the refresh request signal RREQ but the refresh operation of the memory blocks MBLK0-5 is disabled.

As described above, in this embodiment, during an access cycle to one of the memory blocks MBLK, the disable block information (RBA) of the refresh register 16 is rewritten according to the externally input data signal DQ (RBA). Then, a change of the memory block(s) MBLK whose refresh operation is to be executed (the memory block(s) MBLK whose refresh operation is to be disabled) takes place. Here, the access cycle refers to a period from the receipt of an access command signal to the completion of an access operation (5 clock cycles in this example). The refresh register 16 is rewritten every time an access command is supplied. The pulse generation circuit 14 and the data input/output buffer 32 shown in FIG. 1 operate as a register control circuit writing the disable block information RBA to the refresh register 16 during an access cycle. In other words, the register control circuit writes to the refresh register 16 the disable block information RBA supplied via the data terminal DQ during a period in which no data signal is transmitted to the data terminal DQ.

FIG. 5 shows a refresh area change in the first embodiment. In FIG. 5, the access commands and the refresh block address signal RBA supplied to the memory MEM are the same as those in FIG. 4. The hatched memory blocks MBLK in FIG. 5 are those whose refresh operation is executed. The white memory blocks MBLK are those whose refresh operation is disabled.

In this embodiment, it is decided in advance which memory areas of the memory MEM the master controllers MA0-5 assign and the allocation does not change. That is, the use areas that the master controllers MA0-5 use in the memory MEM are statically set. SA and EA in FIG. 5 represent a start address and an end address of each allocated memory area respectively. As for the master controller MA0, a start address SA0 is included in the block MBLK0 and an end address EA0 is included in the block MBLK1. As for the master controller MA1, a start address SA1 and an end address EA1 are included in the block MBLK2. As for the master controller MA2, a start address SA2 and an end address EA2 are included in the block MBLK3. As for the master controller MA3, a start address SA3 is included in the block MBLK3 and an end address EA3 is included in the block MBLK5. As for the master controller MA4, a start address SA4 is included in the block MBLK5 and an end address EA4 is included in the block MBLK6. As for the master controller MA5, a start address SA5 is included in the block MBLK6 and an end address EA5 is included in the block MBLK7.

When the CPU determines that the master controllers MA0-1, 3 access the memory MEM and the master controllers MA2, 4-5 do not access the memory MEM, the CPU sets the master control signals MACT0-1, 3 to high level (H) and sets the master control signals MACT2, 4-5 to low level (L). The external memory area register EMREG shown in FIG. 3 outputs the use area signal MUS (SA0-EA0, SA1-EA1, SA3-EA3) according to the values of the master control signals MACT0-5. The conversion table CTBL outputs the refresh block address signal RBA0 corresponding to the use area signal MUS to the timing control unit TCU. The refresh block address signal RBA representing 3F in hexadecimal is output to the memory MEM in synchronization with the write command WT1. Then, the memory blocks MBLK0-5 are set as refresh enable blocks, and the memory blocks MBLK6-7 are set as refresh disable blocks.

Similarly, when the CPU determines that the master controller MA3 accesses the memory MEM (MACT3=H) and the master controllers MA0-2, 4-5 do not access the memory MEM (MAT0-2, 4-5=L), the external memory area register EMREG outputs the use area signal MUS (SA3-EA3). The memory controller MCNT outputs the refresh block address signal RBA representing 38 in hexadecimal to the memory MEM in synchronization with the read command RD1. Then, the memory blocks MBLK3-5 are set as refresh enable blocks and the memory blocks MBLK0-2, 6-7 are set as refresh disable blocks.

When the CPU determines that the master controller MA5 accesses the memory MEM (MACT5=H) and the master controllers MA0-4 do not access the memory MEM (MACT0-4=L), the external memory area register EMREG outputs the use area signal MUS (SA5-EA5). The memory controller MCNT outputs the refresh block address signal RBA representing C0 in hexadecimal to the memory MEM in synchronization with the write command WT2. Then, the memory blocks MBLK6-7 are set as refresh enable blocks and the memory blocks MBLK0-5 are set as refresh disable blocks.

Figure 6:
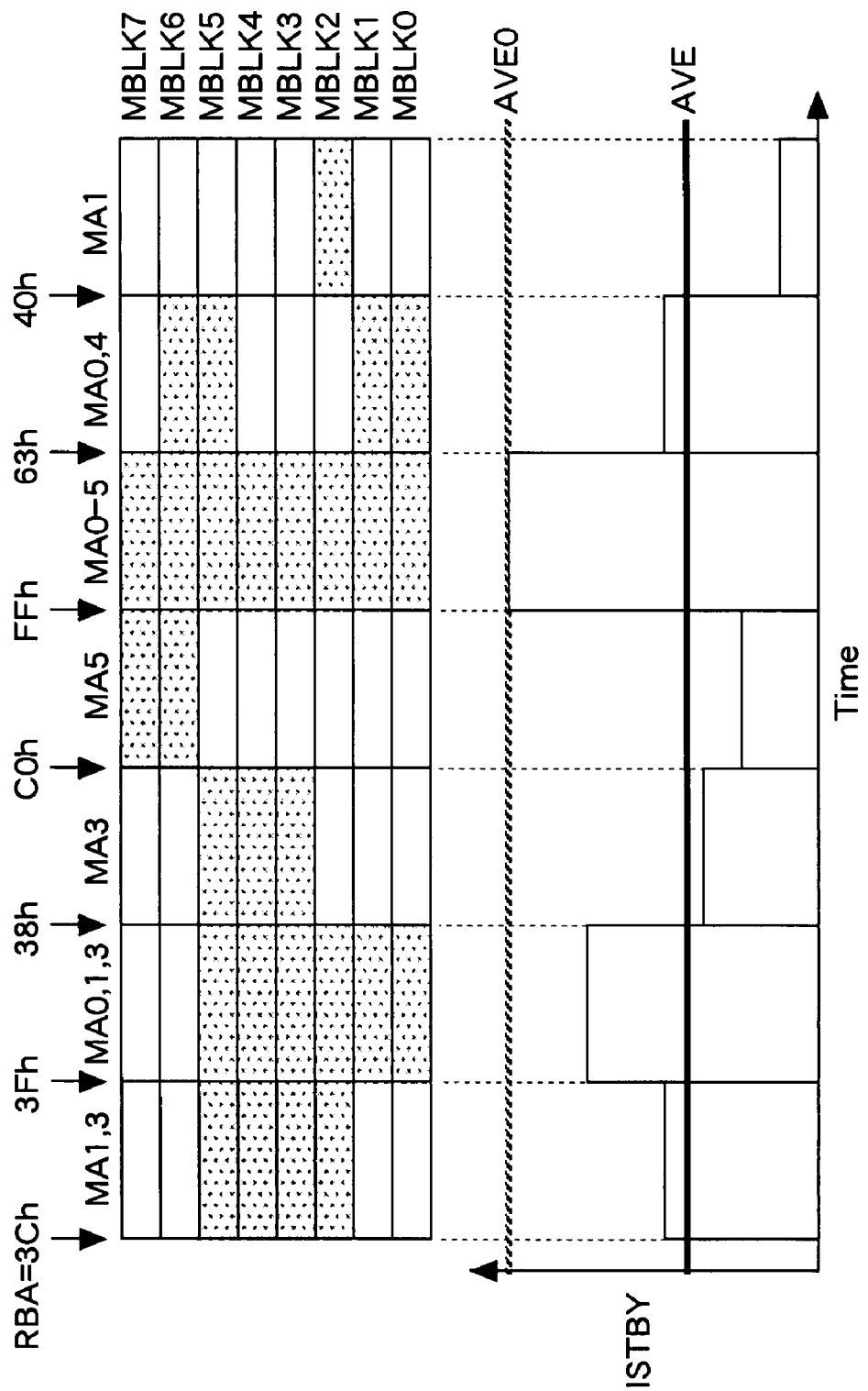
FIG. 6 is an explanatory chart showing a change in standby current in the first embodiment.

FIG. 6 shows a change in standby current ISTBY in the first embodiment. The hatched memory blocks MBLK in FIG. 6 are those whose refresh operation is executed. The white memory blocks MBLK are those whose refresh operation is disabled. Generally, in a semiconductor memory MEM having dynamic memory cells MC, the standby current ISTBY occurs mainly due to the refresh operation.

In this embodiment, the refresh operation is executed only in the memory block(s) MBLK accessed by the operating master controller(s) MA. The standby current ISTBY changes depending on the number of the memory blocks MBLK whose refresh operation is executed. Therefore, an average value AVE of the standby current ISTBY is lower than an average value AVE0 prior to the embodiment. Prior to the embodiment, to change the memory block(s) MBLK whose refresh operation is to be executed, it has been necessary to supply a mode register set command or the like to the semiconductor memory between access operations. An increase in the frequency of changing the memory block(s) MBLK whose refresh operation is executed lowers the effective efficiency of memory access, resulting in deterioration in system performance. Therefore, in actual practice, the refresh operation is usually executed in all the memory blocks MBLK0-7. The average value AVE0 of the standby current ISTBY at this time is equal to the standby current ISTBY that occurs when the refresh operation is executed in all the memory blocks MBLK0-7. Applying the embodiment can make the standby current ISTBY far lower than conventional method. In the embodiment, the number of the memory blocks MBLK whose refresh operation is to be executed can be optimally set without lowering access efficiency, which can make power consumption lower than conventional method.

Figure 7:
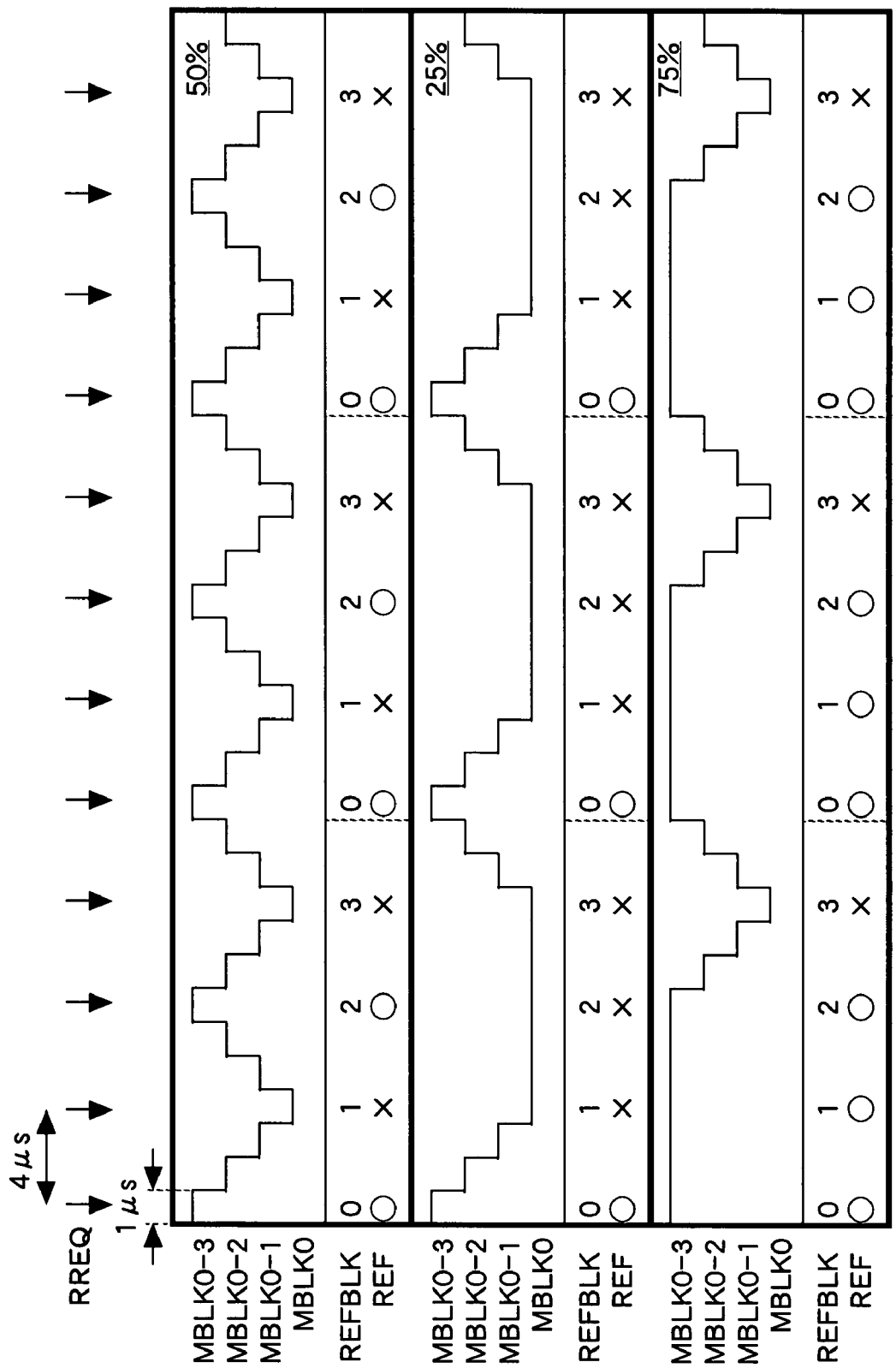
FIG. 7 is an explanatory chart showing an effect of reducing the standby current in the first embodiment.
Figure 8:
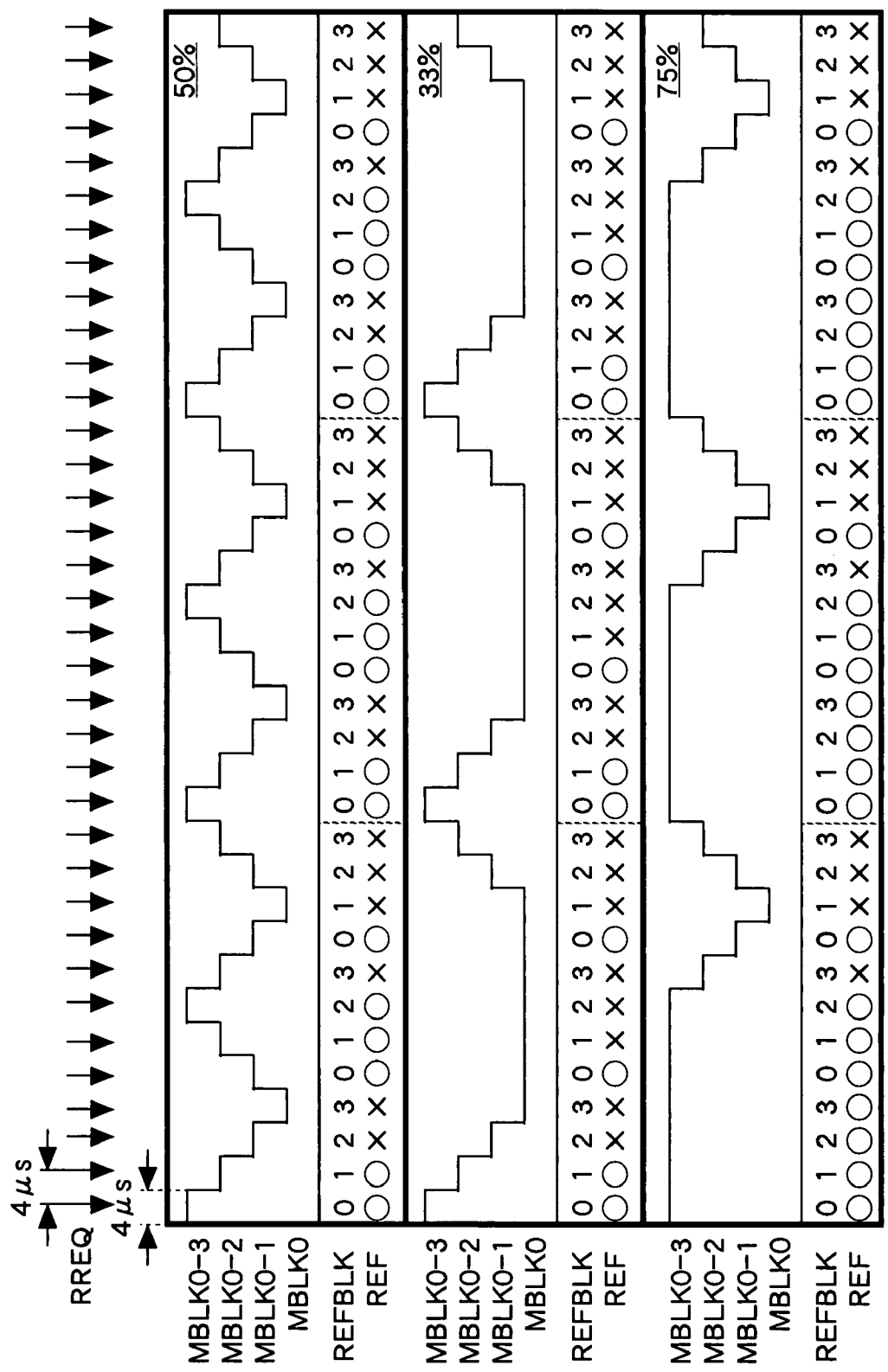
FIG. 8 is an explanatory chart showing an effect of reducing the standby current in the first embodiment.
Figure 9:
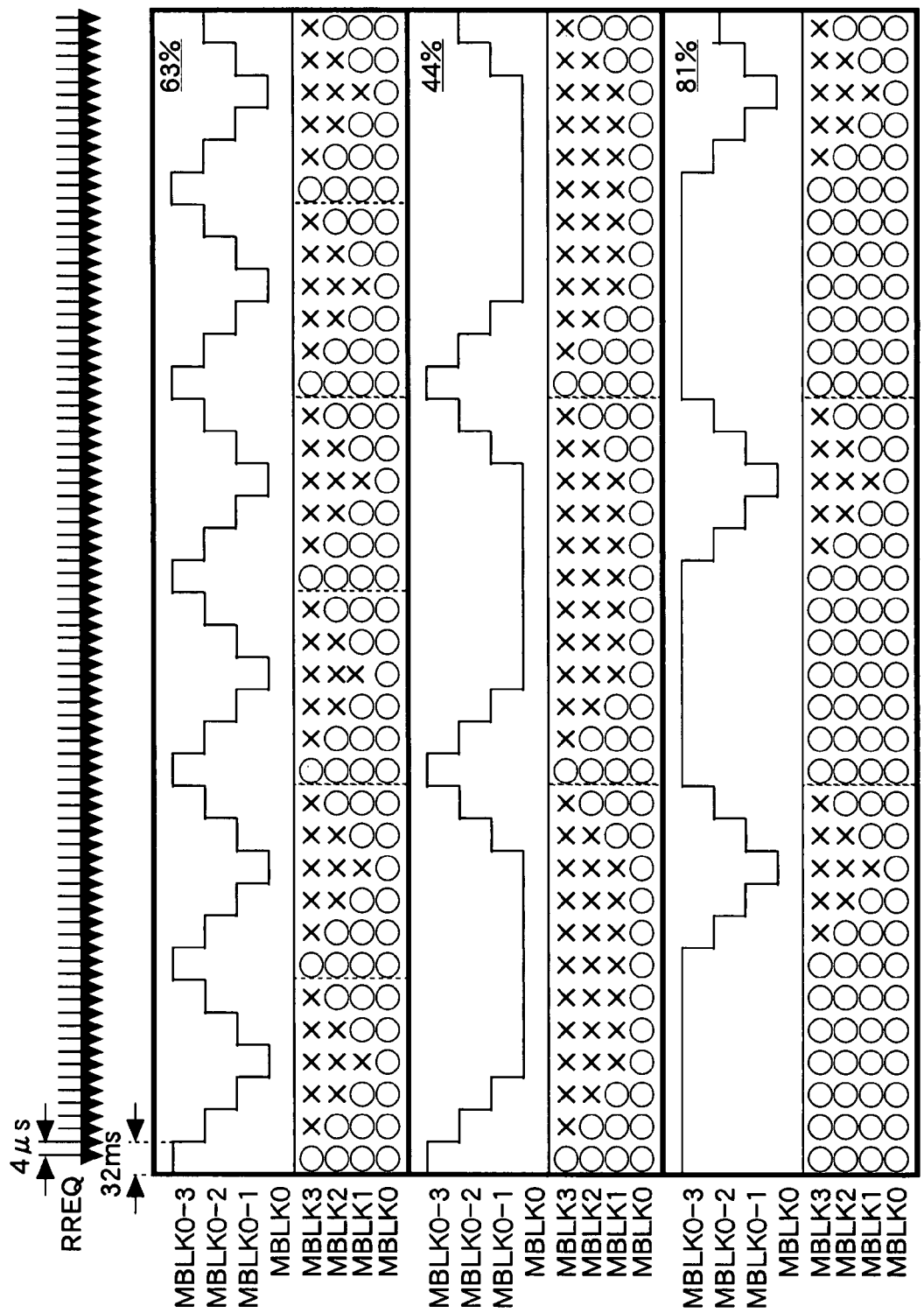
FIG. 9 is an explanatory chart showing an effect of reducing the standby current in the first embodiment.

FIGS. 7-9 show an effect of reducing the standby current ISTBY in the first embodiment. For simpler description, these drawings show examples where the memory MEM has four memory blocks MBLK0-3. The MBLK0-3, MBLK0-2, MBLK0-1, and the MBLK0 on the left in the drawings are memory blocks MBLK whose refresh operation is executed. REFBLK indicates the number of the memory block MBLK whose refresh operation is to be executed. As described in FIG. 1, since the low-order bits of the refresh address signal RRAD from the refresh address counter 26 are allocated for the selection of the memory blocks MBLK, the memory block MBLK whose refresh operation REF is executed is sequentially changed every time the refresh request signal RREQ is generated. Each circle in the drawings represents that the refresh operation REF is executed in the corresponding memory block MBLK in response to the refresh request signal RREQ (refresh enable block). Each x mark in the drawings represents that the refresh operation REF is not executed in the corresponding memory block MBLK even when the refresh request signal RREQ is generated (refresh disable block). Each numerical value (%) in the frames in the drawings represents a ratio of the standby current ISTBY to the standby current that occurs when the refresh operation is executed in all the memory blocks MBLK0-3.

FIG. 7 shows a case where the refresh request signal RREQ is generated every 4 microseconds and the frequency of changing the memory block MBLK to be refreshed is shorter than the generation period of the refresh request signal RREQ (for example, 1 microsecond). FIG. 8 shows a case where the refresh request signal RREQ is generated every 4 microseconds and the frequency of changing the memory block MBLK to be refreshed is the same as the generation period of the refresh request signal RREQ. FIG. 9 shows a case where the refresh request signal RREQ is generated every 4 microseconds and the frequency of changing the memory block MBLK to be refreshed is longer than the generation period of the refresh request signal RREQ (for example, 32 milliseconds). The circles and the x marks in FIG. 9 indicate that the corresponding memory blocks MBLK are refresh enable blocks or refresh disable blocks. In any of the above cases, it is possible to reduce the standby current ISTBY by disabling the refresh operation REF of the memory block MBLK accessed by none of the master controllers MA.

Figure 10:
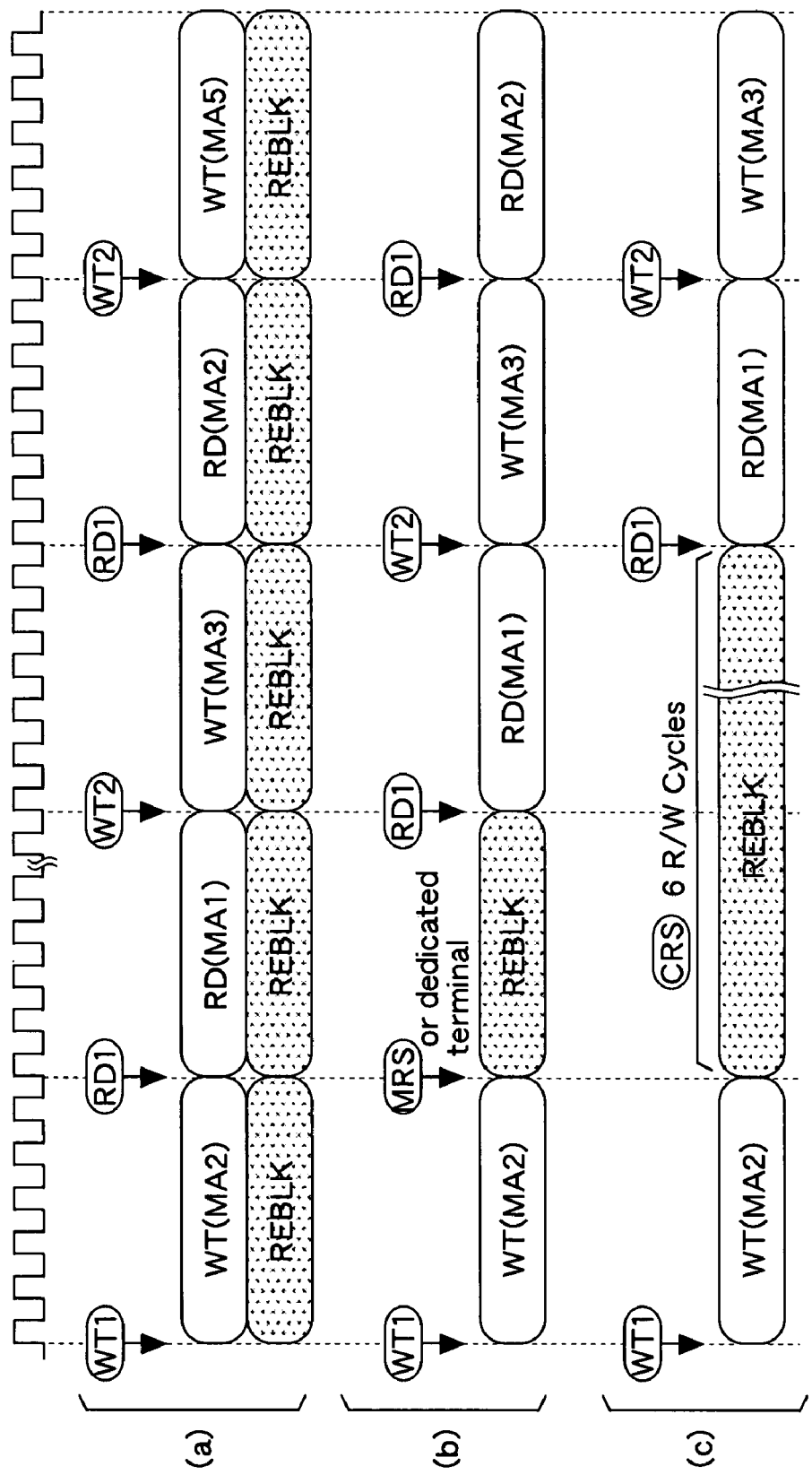
FIG. 10 is an explanatory chart showing operations of the semiconductor memory of the first embodiment.

FIG. 10 shows operations of the semiconductor memory MEM of the first embodiment. (a) in FIG. 10 shows the operations of embodiment, and (b) and (c) in FIG. 10 show operations prior to embodiment. In the embodiment, the memory block MBLK whose refresh operation is to be executed (refresh enable block REBLK) is set every time the access operation (the write operation or the read operation) in response to the write command WT or the read command RD is executed. That is, the refresh enable block REBLK is set while the access operation is being executed. It is possible to change the refresh block REFBLK according to the operation states of the master controllers MA0-5, without lowering the efficiency of the access operation. As a result, the standby current ISTBY and an operation current can be reduced without lowering performance of the system SYS.

On the other hand, in (b) prior to the embodiment, it has been necessary to insert a mode register set command MRS between access commands in order to change the refresh enable block REBLK. Instead, it has been necessary to supply a command for changing the refresh block REFBLK from a dedicated terminal between the access commands. In (c) prior to the embodiment, it has been necessary to insert a configuration register set command CRS between access commands in order to change the refresh enable block REBLK. The set command CRS needs, for example, six read/write cycles (R/W). As a result, the efficiency of access operations is lowered, which deteriorates performance of the system SYS.

Figure 11:
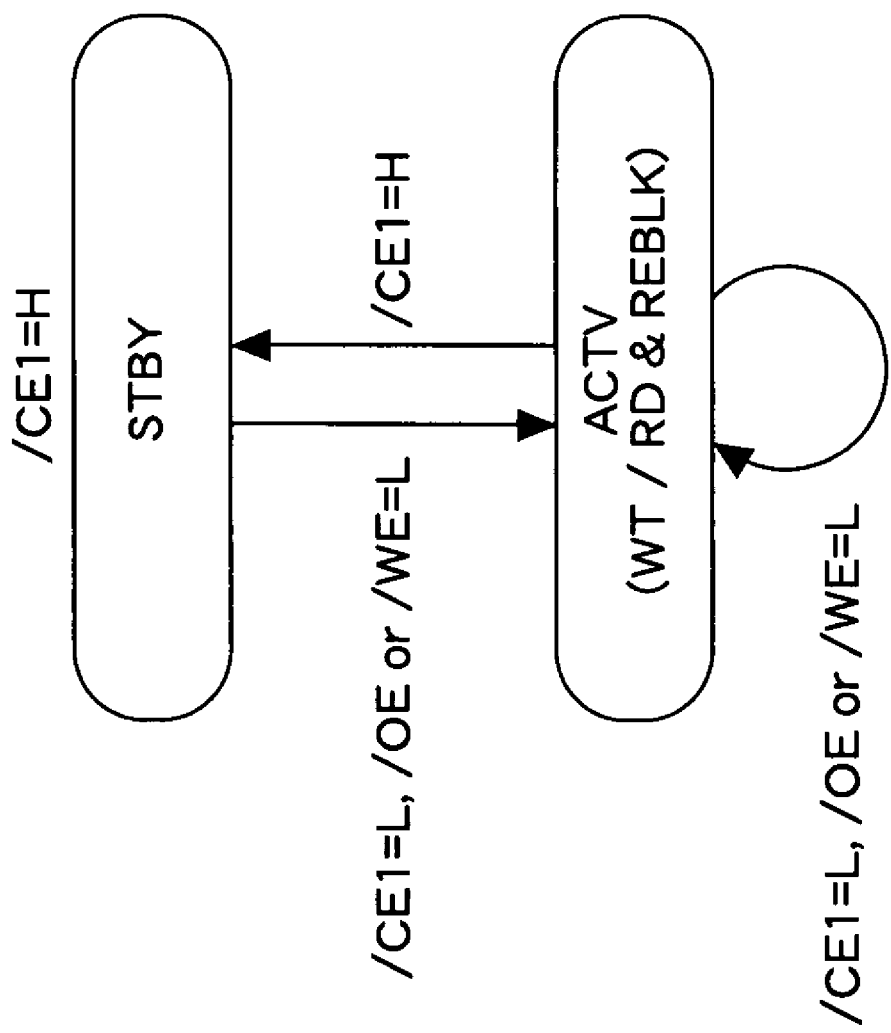
FIG. 11 is a state transition diagram, showing the operation of the semiconductor memory of the first embodiment.

FIG. 11 shows transition of the operation state of the semiconductor memory MEM of the first embodiment. In this embodiment, in accordance with a change of the chip enable signal /CE1 to low level L during a standby state STBY (/CE1=H), the state of the memory MEM shifts to an active state ACTV. In accordance with the supply of the write command WT (/WE=L, /OE=H) or the read command RD (/WE=H, /OE=L) in the active state ACTV, the write operation WT or the read operation RD is executed, and at the same time, the refresh enable block REBLK is set. In accordance with a change of the chip enable signal /CE1 from low level L to high level H, the state of the memory MEM shifts from the active state ACTV to the standby state STBY. In the last access operation before the standby state STBY, the optimum refresh enable block REBLK is set. Since the refresh operation is executed only in the minimum number of the memory blocks MBLK, it is possible to make the standby current ISTBY lower than conventional method. Further, that the state transition diagram can be simply depicted means that control logic of the memory MEM can be simplified. As a result, circuit scale of the memory controller MCNT can be reduced.

Figure 12:
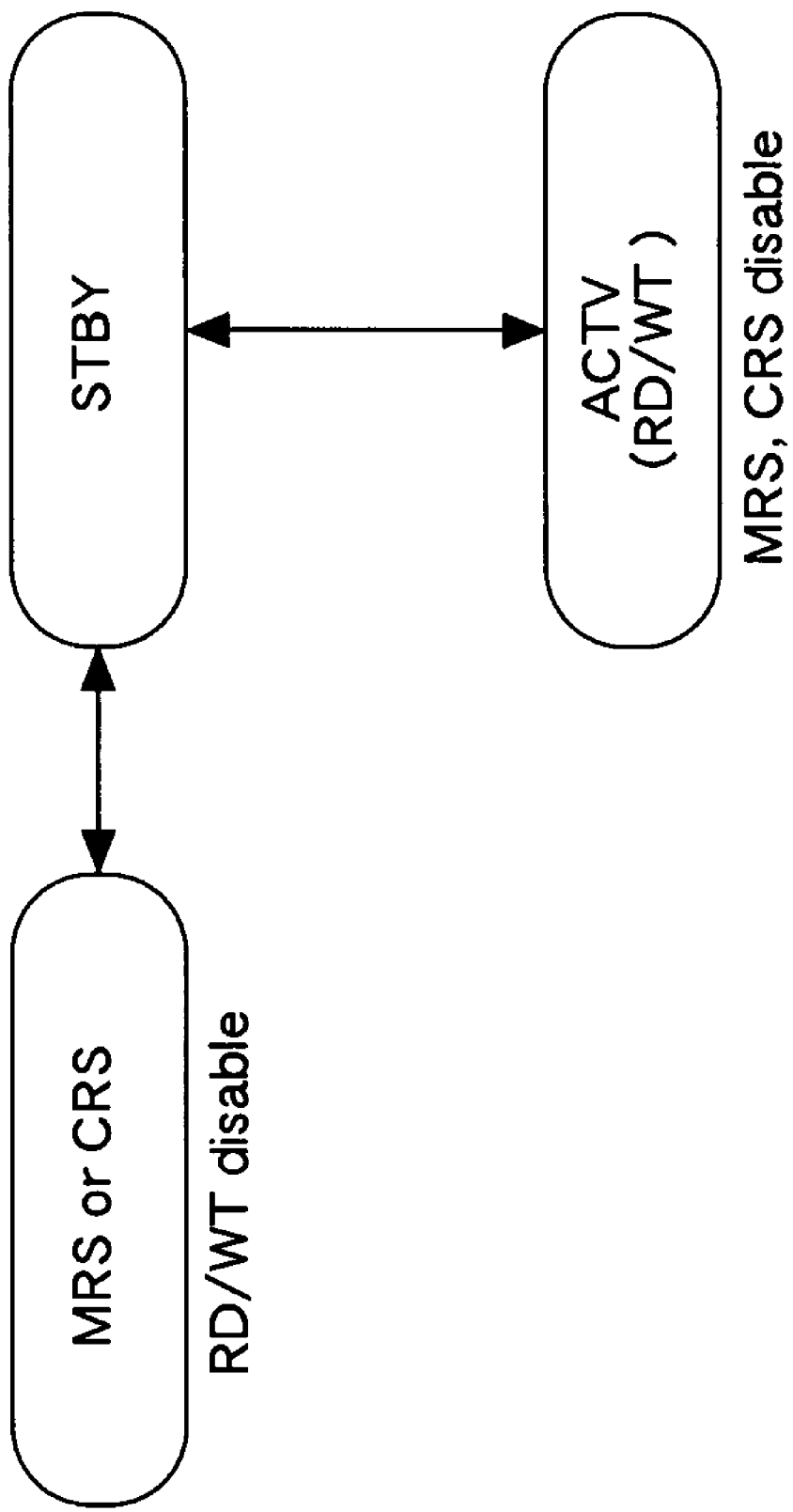
FIG. 12 is a state transition diagram showing an example of the operation of a semiconductor memory prior to the present embodiment.

FIG. 12 shows an example of transition of the operation state of a semiconductor memory prior to the embodiment. Prior to the embodiment, to change the refresh enable block REBLK, the mode register set command MRS or the configuration register set command CRS is supplied. The access command RD/WT cannot be supplied while the register set command MRS or CRS is supplied (RD/WT is disabled). Similarly, during an active period ACTV (during an access operation RD/WD), the register set command MRS or CRS cannot be supplied (MRS or CRS is disabled). Therefore, changing the refresh enable block REBLK lowers access efficiency.

Figure 13:
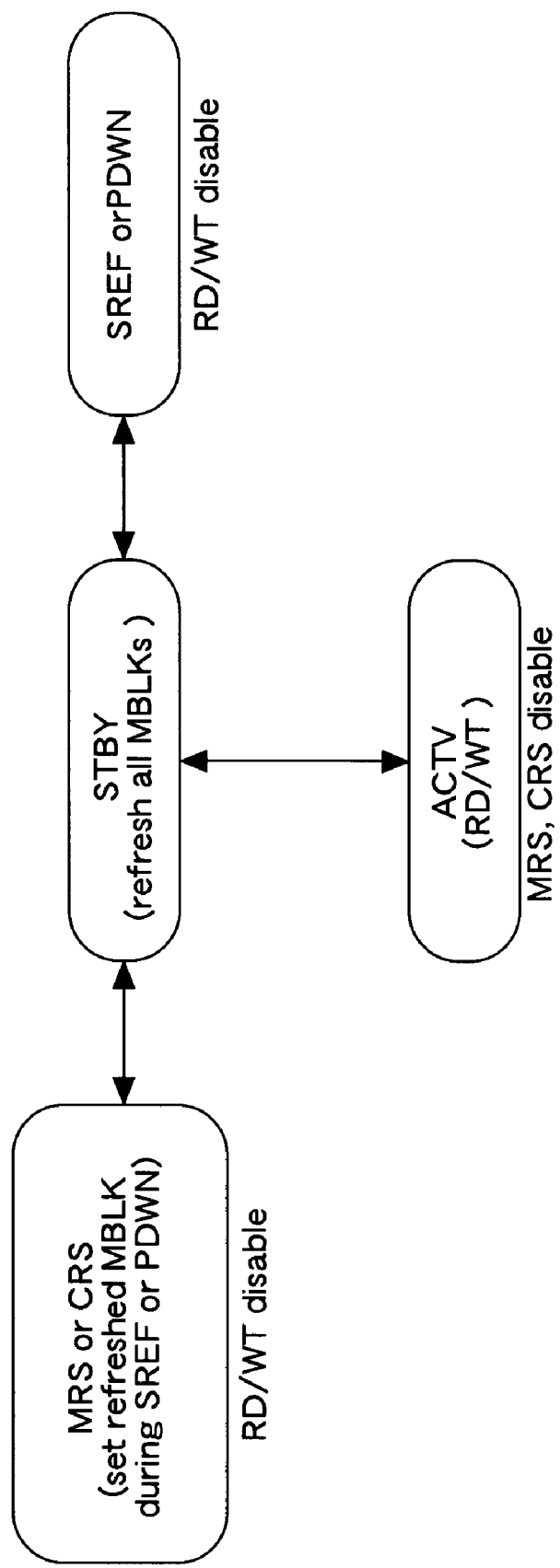
FIG. 13 is a state transition diagram showing another example of the operation of a semiconductor memory prior to the present embodiment.

FIG. 13 shows another example of transition of the operation state of a semiconductor memory prior to the embodiment. In this example, the memory block MBLK whose refresh operation is to be executed is set during a self-refresh mode SREF or a power-down mode PDWN in response to the register set command MRS or CRS. While the register set command MRS or CRS is supplied, the access command RD/WT cannot be supplied (RD/WT is disabled). The standby mode STBY is an operation mode during which the external access command RD/WT is not supplied (for example, /CE1=H). In the standby mode STBY, the refresh operation of all the memory blocks MBLK is executed. The self-refresh mode SREF and the power-down mode PDWN are operation modes in which only the refresh operation is executed in at least part of the memory blocks MBLK in response to a refresh request signal generated in the memory MEM and the access operation cannot be executed immediately. Further in FIG. 13, during the active period ACTV (during the access operation RD/WT), the register set command MRS or CRS cannot be supplied, and therefore, changing the refresh enable block REBLK lowers access efficiency.

In the first embodiment described above, in order to rewrite the refresh register 16, it is not necessary to use the extra operation cycle in addition to an access cycle. In other words, the refresh register 16 can be rewritten simultaneously with the access cycle. Since an extra operation cycle need not be inserted, it is possible to change a memory area to be refreshed without lowering effective efficiency of the access cycle. As a result, power consumption can be reduced.

Further, generally, the data terminal DQ consists of a plurality of bits and its input/output timing of a data signal is the same for all the bits. Therefore, the use of the data terminal DQ makes it possible to easily set each of the memory blocks MBLK0-7 as a refresh enable block or a refresh disable block.

Figure 14:
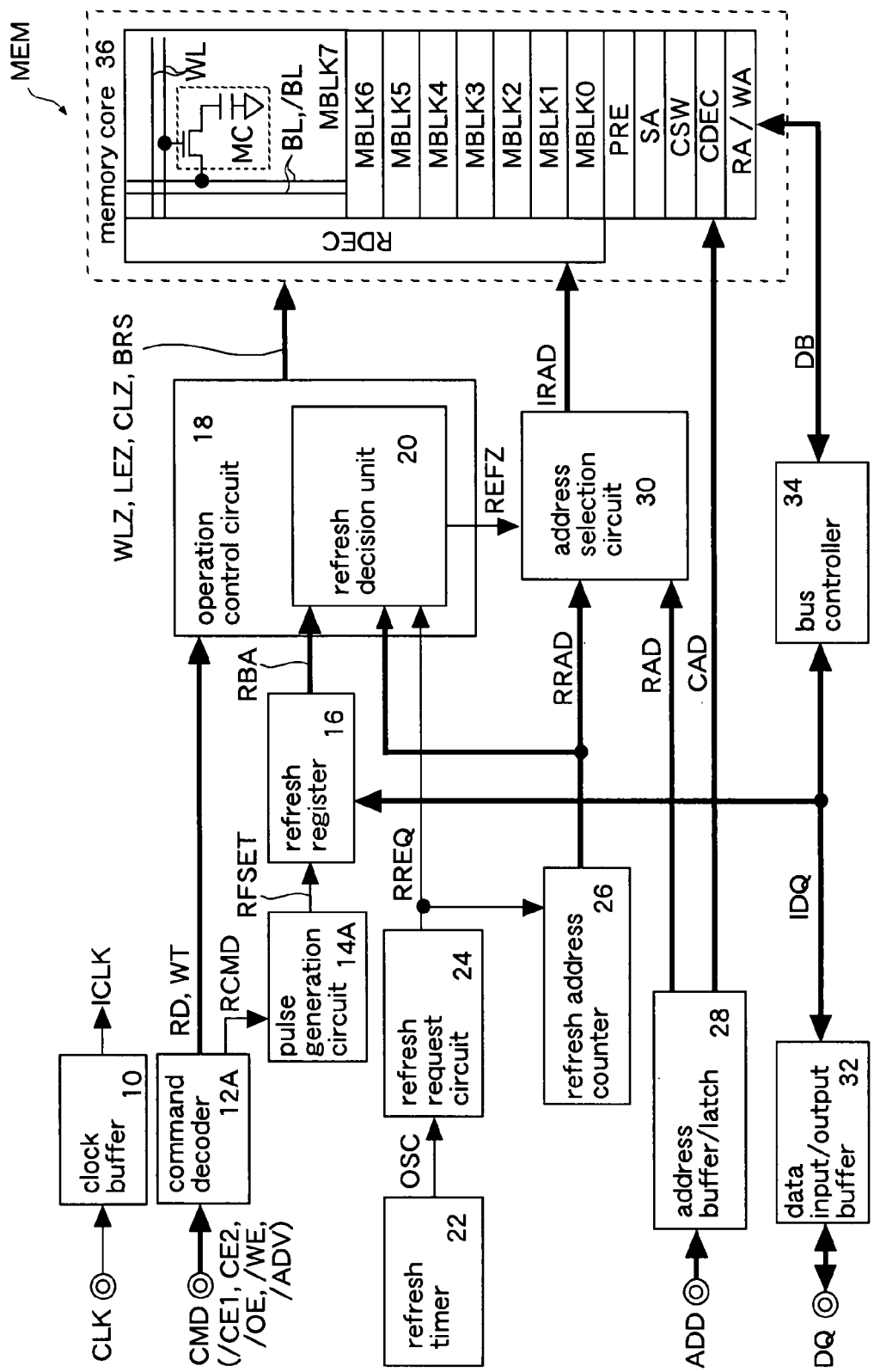
FIG. 14 is a block diagram showing a semiconductor memory of a second embodiment.

FIG. 14 shows a semiconductor memory MEM of a second embodiment. The same elements as the elements described in the first embodiment are denoted by the same reference numerals and symbols as those used in the first embodiment, and detailed description thereof will be omitted. In this embodiment, a command decoder 12A and a pulse generation circuit 14A are formed in place of the command decoder 12 and the pulse generation circuit 14 of the first embodiment. The other configuration is the same as that of the first embodiment. That is, the semiconductor memory MEM is, for example, a clock synchronous type FCRAM operating in synchronization with an external clock CLK. A system SYS and a memory controller MCNT of this embodiment are the same as those of the first embodiment (FIG. 2, FIG. 3).

As a command terminal CMD, the memory MEM has a chip enable terminal CE2 in addition to those in FIG. 1. The command decoder 12A outputs a read command signal RD, a write command signal WT, or a register command signal RCMD according to logic level of a command signal CMD. The register command signal RCMD is a command signal to rewrite the refresh register 16. The pulse generation circuit 14A outputs an area set signal RFSET in response to the register command signal RCMD. The command decoder 12A, the pulse generation circuit 14A, and the data input/ output buffer 32 operate as a register control circuit writing disable block information RBA to the refresh register 16 during an access cycle.

Figure 15:
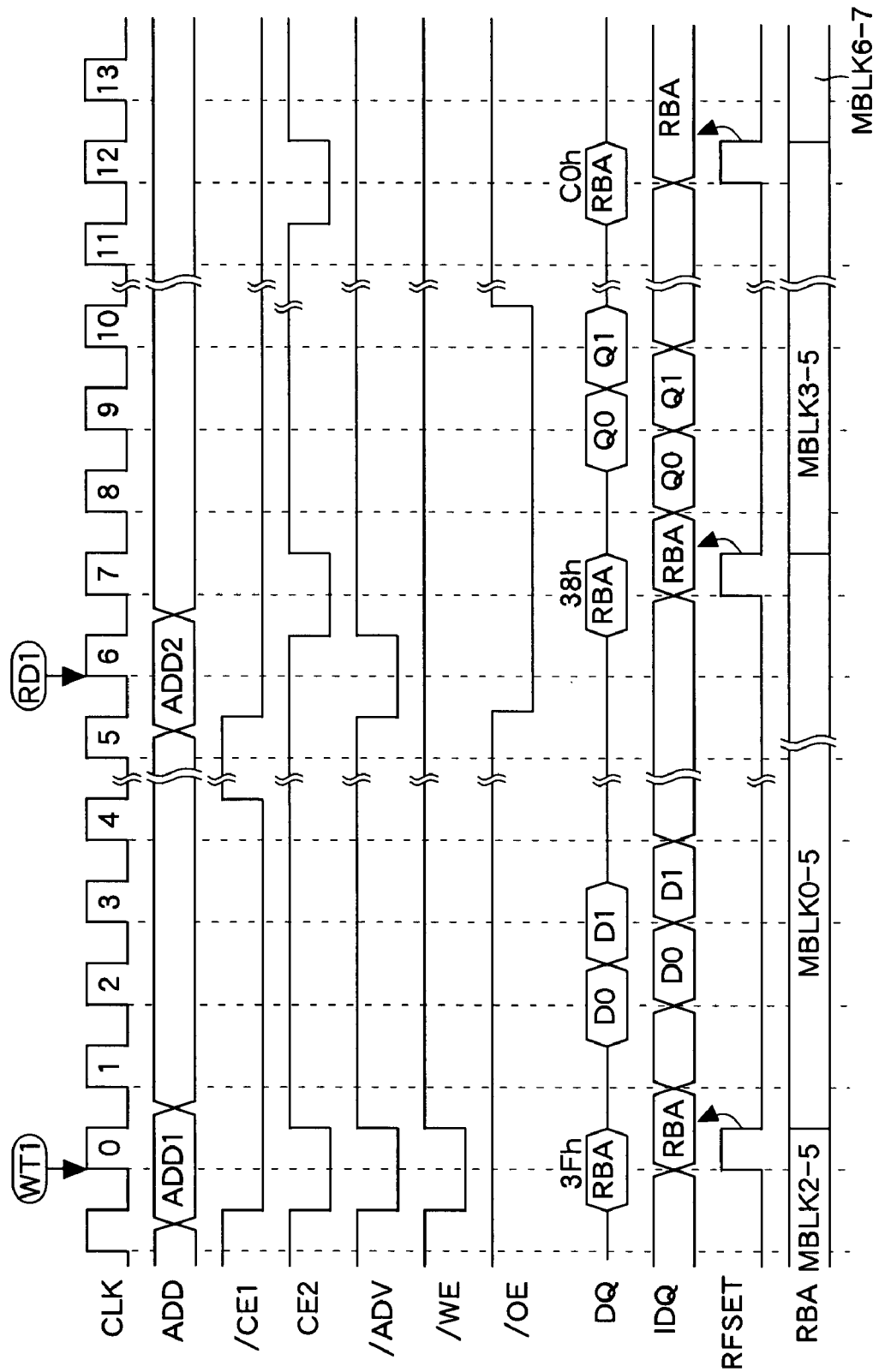
FIG. 15 is a timing chart showing operations of the semiconductor memory of the second embodiment.

FIG. 15 shows operations of the semiconductor memory MEM of the second embodiment. The same operations as those of the first embodiment will not be described in detail. Operations of the memory MEM except those shown in FIG. 15 are the same as those in FIG. 5 to FIG. 10 described above. However, in this embodiment, in a case where there is a period, such as the 12th clock cycle, in which no access operation WT, RD is executed, the register command RCMD is supplied instead of the mode register set command MRS in (b) in FIG. 10, thereby enabling rewriting of a refresh block address signal RBA.

Figure 16:
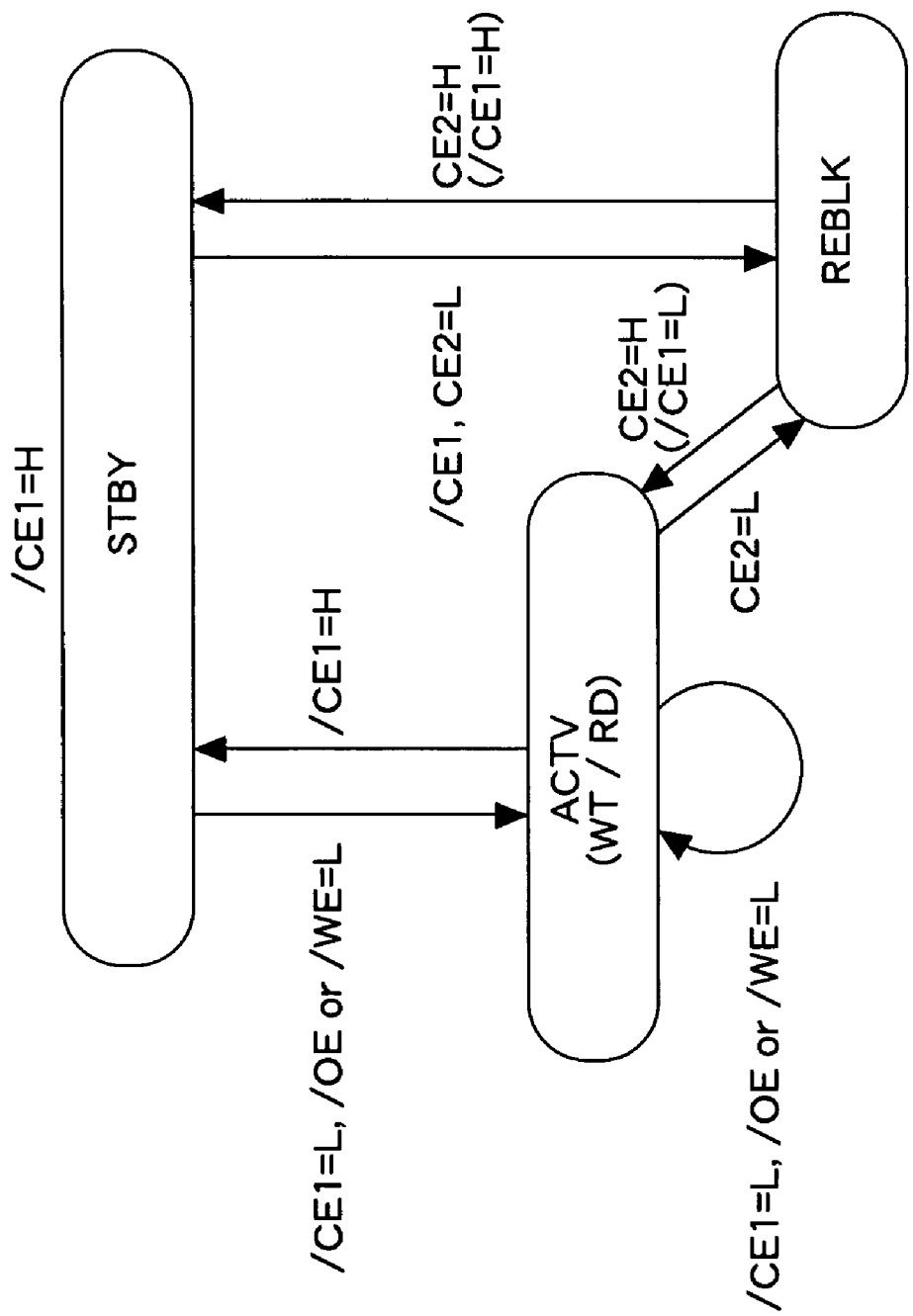
FIG. 16 is a state transition diagram showing the operation of the semiconductor memory of the second embodiment.

In this example, a write command WT1 and a read command RD1 are sequentially supplied to the memory MEM from the memory controller MCNT. After a read operation in response to the read command RD1 is executed, a /CE1 signal keeps low level so that the memory MEM is kept in an active state ACTV (FIG. 16). Upon receipt of the /CE1 signal and CE2 signal with low level, the memory MEM recognizes the register command RCMD to output an area set signal RFSET. Then, in synchronization with a falling edge of the area set signal RFSET, the memory MEM holds the transmitted refresh block address signal RBA (disable block information) supplied via the data terminal DQ (IDQ).

In this example, the register command RCMD is supplied in synchronization with 0th, 7th, and 12th clock signals CLK during data idle periods in which no data signal DQ is transmitted to the data terminal DQ. The register command RCMD can be supplied not only during an access cycle but also during a non-access cycle, in synchronization with a change of the CE2 signal to low level during a low-level period, of the /CE1 signal. That is, the refresh block address signal RBA (disable block information) can be supplied in parallel to the access cycle. Therefore, the register command signal RCMD can be supplied more flexible.

FIG. 16 shows transition of the operation state of the semiconductor memory MEM of the second embodiment. The same operations as those in FIG. 11 will not be described in detail. In this embodiment, during a read operation (RD), a write operation (WT), or a standby state (STBY), a refresh enable block REBLK is set in synchronization with a change of the CE2 signal to low level L. To return to the read operation (RD), the write operation (WT), or the standby state STBY from the state where the refresh enable block REBLK is set, the CE2 signal is changed to high level H.

Incidentally, in a conventional pseudo SRAM-type FCRAM, when the CE2 signal changes to low level during a standby mode, the standby mode shifts to a power-down mode in which an internal operation except the refresh operation of a memory area selected in advance is disabled. It is also possible to disable the refresh operation of all the memory areas. In this embodiment, the refresh block address signal RBA can be supplied even while the access command is executed, and the refresh enable block REBLK is always set in an optimum condition. Therefore, the power-down mode is not necessary. However, in a case where a power-down mode in which the address buffer 28, the data input/ output buffer 32, and so on are deactivated is necessary, the mode may be shifted to the power-down mode when the CE2 signal changes to low level during a high-level period of the /CE1 signal, while the refresh enable block REBLK is set when the CE2 signal changes to low level during a low-level period of the /CE1 signal.

The second embodiment described above can also provide the same effects as those of the first embodiment previously described. In addition, in this embodiment, the refresh register 16 is rewritten in synchronization with the externally supplied register command RCMD. Consequently, the system SYS can rewrite the refresh register 16 by the register command RCMD at an arbitrary timing during the data idle period in which the data terminal DQ is not in use. Since the timing of the register command RCMD is not limited to other commands timing, it is possible to flexibly control the operation timing of the memory controller MCNT and the system SYS.

Figure 17:
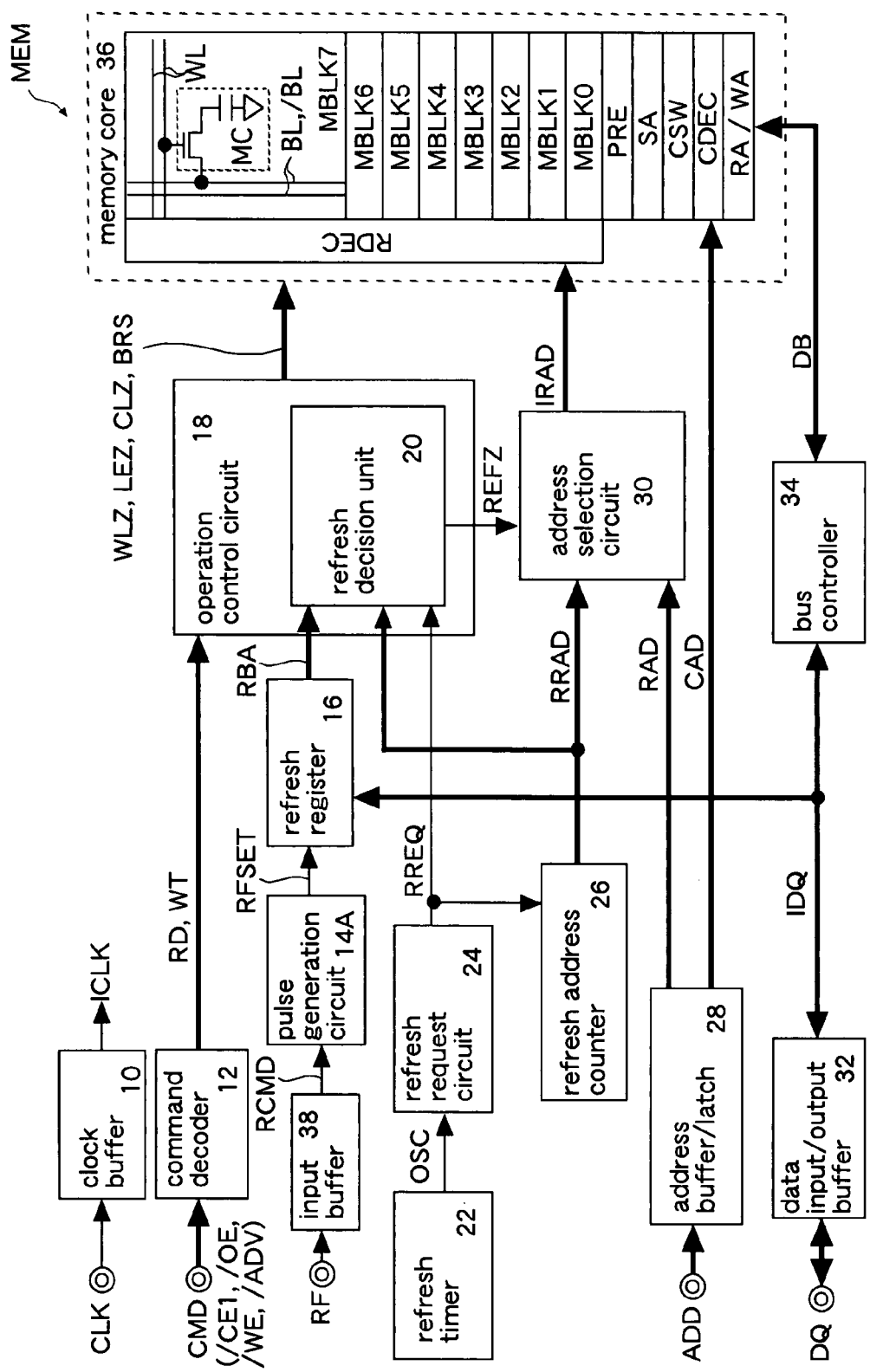
FIG. 17 is a block diagram showing a semiconductor memory of a third embodiment.

FIG. 17 shows a semiconductor memory MEM of a third embodiment. The same elements as the elements described in the first embodiment are denoted by the same reference numerals and symbols as those used in the first embodiment, and detailed description thereof will be omitted. In this embodiment, a pulse generation circuit 14A is formed in place of the pulse generation circuit 14 of the first embodiment. Further, this embodiment is configured such that an input terminal RF and an input buffer 38 are added to the semiconductor memory MEM of the first embodiment. The other configuration is the same as that of the first embodiment. That is, the semiconductor memory MEM is, for example, a clock synchronous type FCRAM operating in synchronization with an external clock CLK. A system SYS and a memory controller MCNT of this embodiment are the same as those of the first embodiment (FIG. 2, FIG. 3).

The input buffer 38 receives an input signal RF (dedicated signal) supplied via the input terminal RF (dedicated terminal) and outputs to the pulse generation circuit 14A the received signal as a register command signal RCMD. The register command signal RCMD is a command signal to rewrite the refresh register 16 as in the second embodiment. The pulse generation circuit 14A outputs an area set signal RFSET in response to the register command signal RCMD. The input buffer 38, the pulse generation circuit 14A, and the data input/output buffer 32 operate as a register control circuit writing disable block information RBA to the refresh register 16 during an access cycle.

Figure 18:
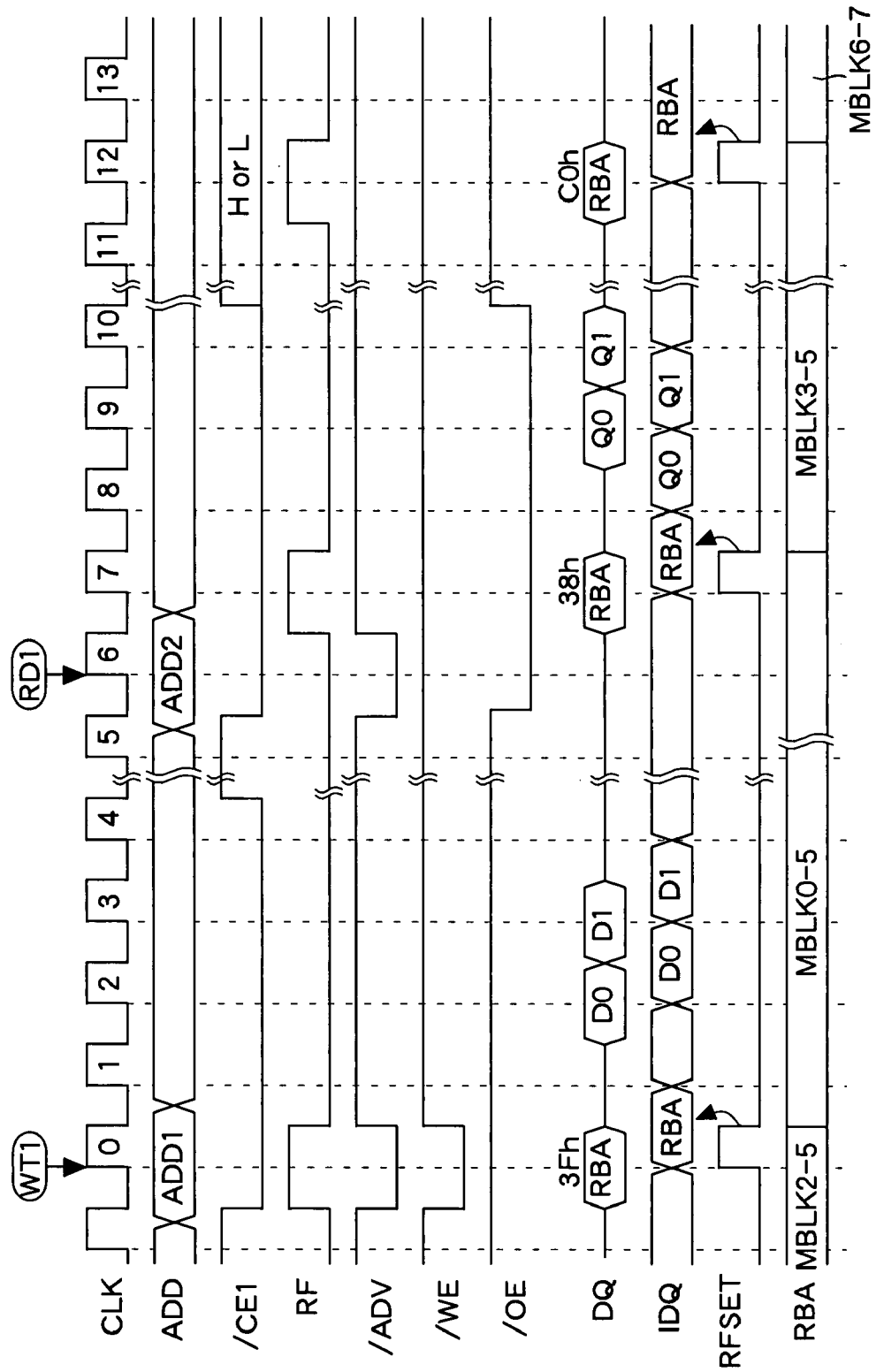
FIG. 18 is a timing chart showing operations of the semiconductor memory of the third embodiment.

FIG. 18 shows operations of the semiconductor memory MEM of the third embodiment. The same operations as those of the first and second embodiments (FIG. 4, FIG. 15) will not be described in detail. Operations of the memory MEM other than those shown in FIG. 18 are the same as those shown in FIG. 5-FIG. 10 described above. Further, in this embodiment, the refresh block address signal RBA can be rewritten also while a /CE1 signal is set to high level (standby state STBY).

The operations shown in FIG. 18 are the same as those of the second embodiment (FIG. 15) except in that the RF signal is supplied instead of the CE2 signal and a /CE1 signal in the 12th clock cycle may be set to high level H. That is, in this example, the RF signal is supplied and the refresh block address signal RBA is supplied via the data terminal DQ, in synchronization with the 0th, 7th, and 12th clock signals CLK during data idle periods in which no data signal DQ is transmitted to the data terminal DQ. As is seen in the 12th clock cycle, the RF signal can be supplied irrespective of the level of the /CE1 signal. This enhances a degree of freedom in rewriting the refresh block address signal RBA. The RF signal can be supplied at an arbitrary timing in a period in which the data terminal DQ is not in use. For example, the RF signal may be supplied in synchronization with a write command WT1 and a read command RD1.

Figure 19:
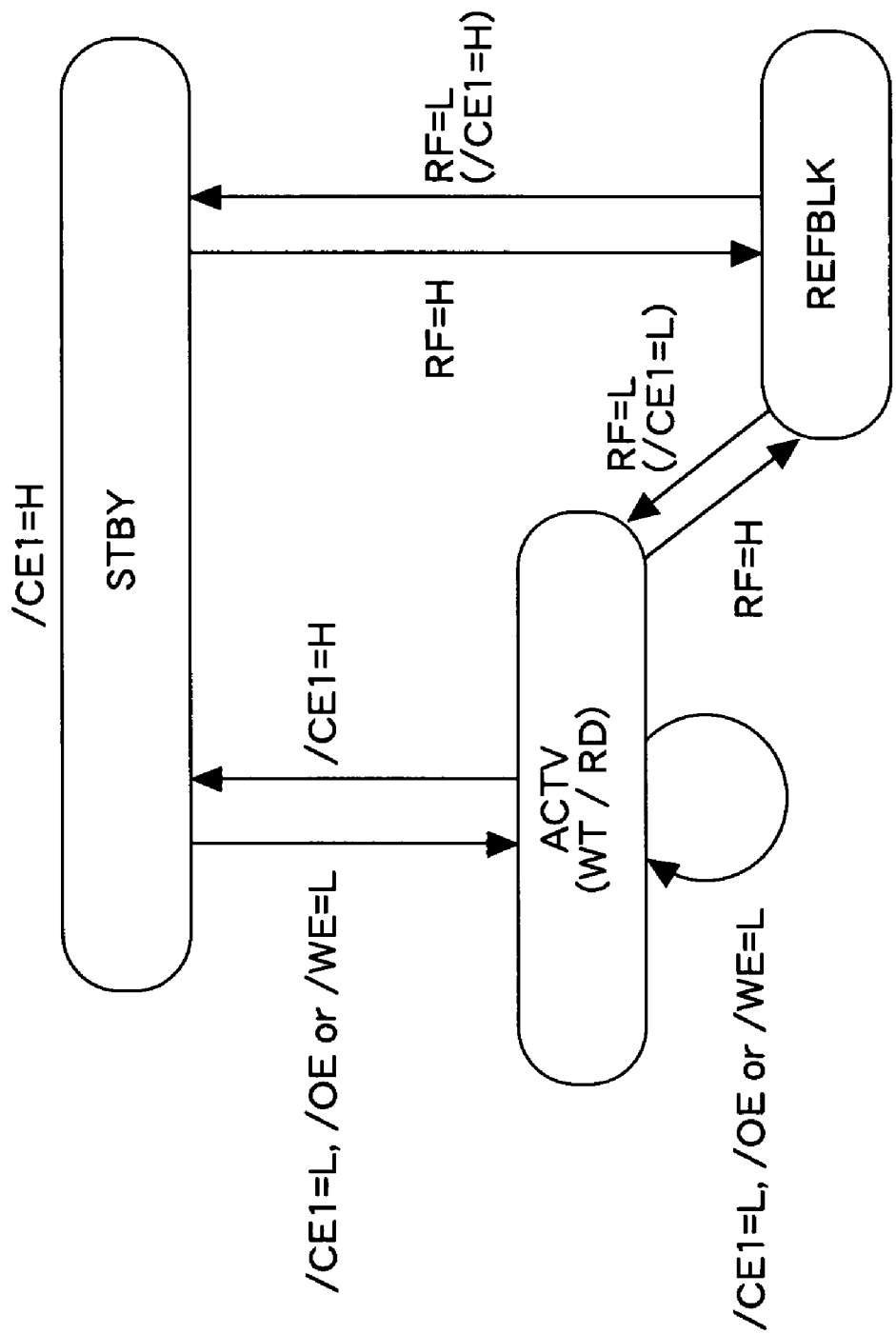
FIG. 19 is a state transition diagram showing the operation of the semiconductor memory of the third embodiment.

FIG. 19 shows transition of the operation state of the semiconductor memory MEM of the third embodiment. The same operations as those in FIG. 11 will not be described in detail. In this embodiment, during a read operation (RD), a write operation (WT), an active state (ACTV) in which no read operation RD and no write operation WT are executed, or a standby state (STBY), a refresh enable block REBLK is set in synchronization with a change of the RF signal to high level H. When the RF signal changes to low level L during a period in which the /CE1 is set to low level L, the state in which the refresh enable block REBLK is set shifts to the active state ACTV. When the RF signal changes to low level L during a period in which the /CE1 is set to high level H, the state in which the refresh enable block REBLK is set shifts to the standby state STBY.

The third embodiment described above can also provide the same effects as those of the first and second embodiments previously described. In addition, in this embodiment, the refresh enable block REBLK can be rewritten irrespective of the level of the /CE1 signal. As a result, the refresh block address signal RBA can be rewritten more flexible. That is, flexibility usability of the memory MEM can be further improved, and performance of the memory controller MCNT and the system SYS can be further improved.

Figure 20:
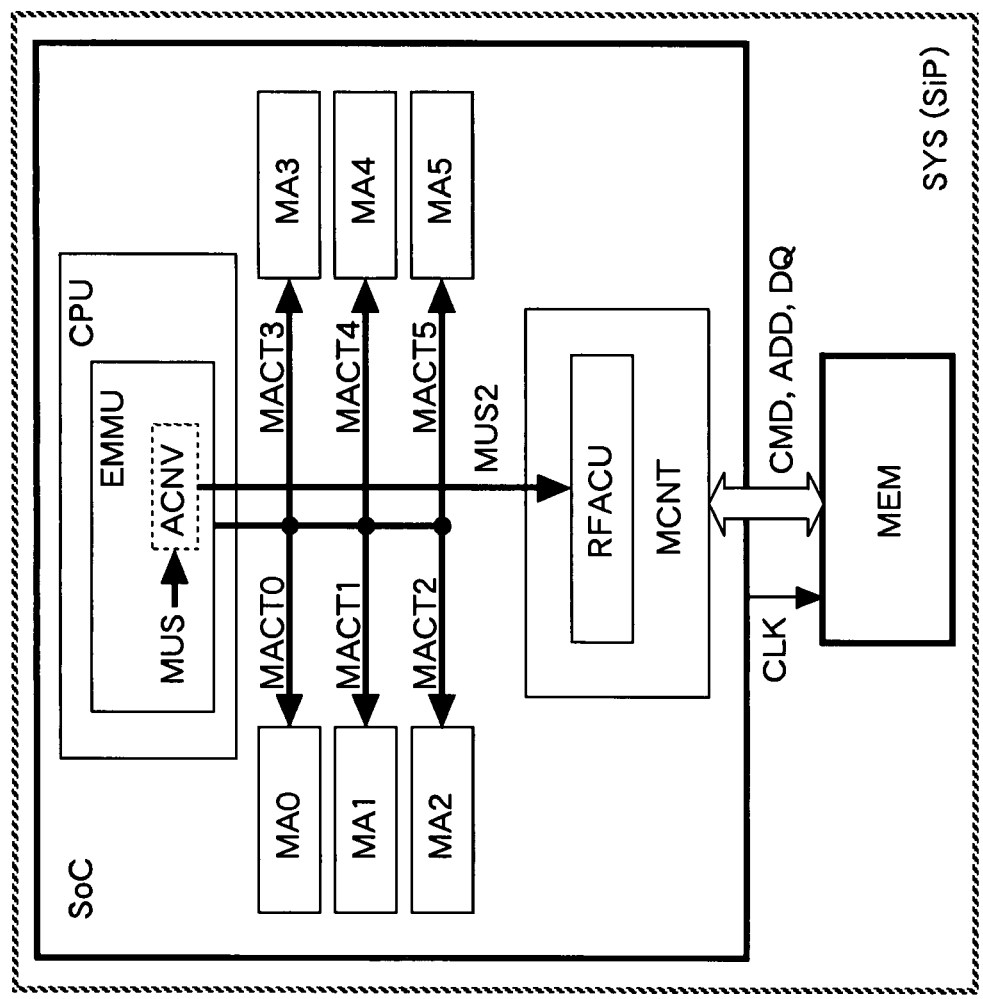
FIG. 20 is a block diagram showing a system of a fourth embodiment.
Figure 22:
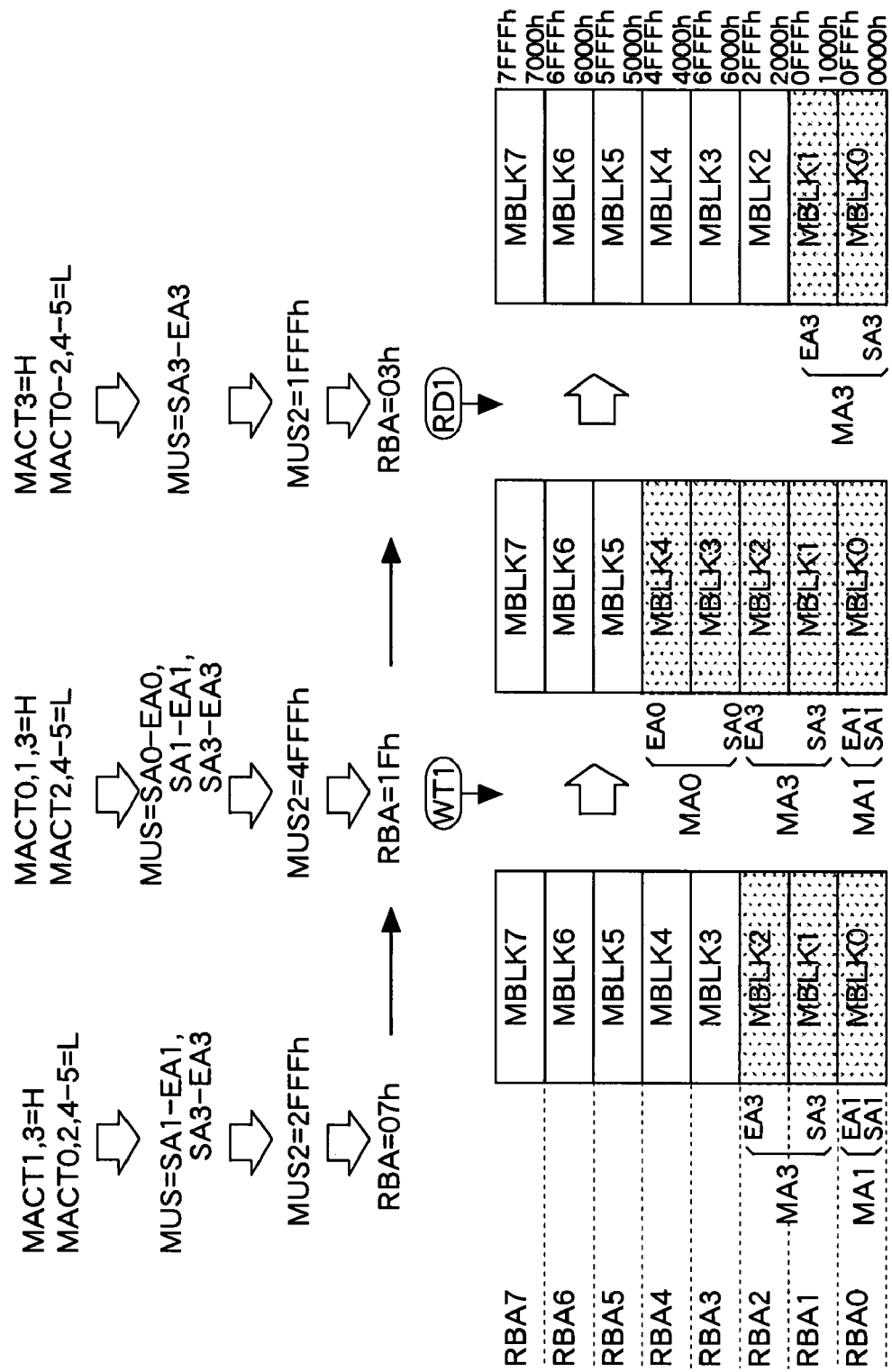
FIG. 22 is an explanatory chart showing a refresh area change in the fourth embodiment.

FIG. 20 shows a system SYS of a fourth embodiment. The same elements as those of the first embodiment (FIG. 2) will not be described in detail. In this embodiment, as shown in FIG. 22 to be described later, the memory blocks MBLK used by the master controllers MA0-5 are decided by the CPU according to the operation state of the system SYS. That is, the use areas that the master controllers MA0-5 use in the memory MEM are set dynamically. For this purpose, the CPU has an external memory management unit EMMU in place of the master control unit MACU in FIG. 2.

According to a use area signal MUS generated in the CPU, the external memory management unit EMMU generates a use area signal MUS2 indicating addresses of the memory block(s) MBLK whose refresh operation is to be executed. Example values of the use area signal MUS2 will be described in FIG. 22. On the SoC, there is a dedicated signal line MUS2 transmitting the use area signal MUS2 to the refresh area control unit RFACU of the memory controller MCNT from the CPU. Incidentally, the use area signal MUS2 may be transmitted during a period in which no address signal or no data signal is transmitted, by utilizing an internal address bus or an internal data bus wired between the CPU and the memory controller MCNT. The other configuration of the system SYS is the same as that in FIG. 2. The memory MEM shown in FIG. 20 is the same as the memory MEM of the first embodiment.

Figure 21:
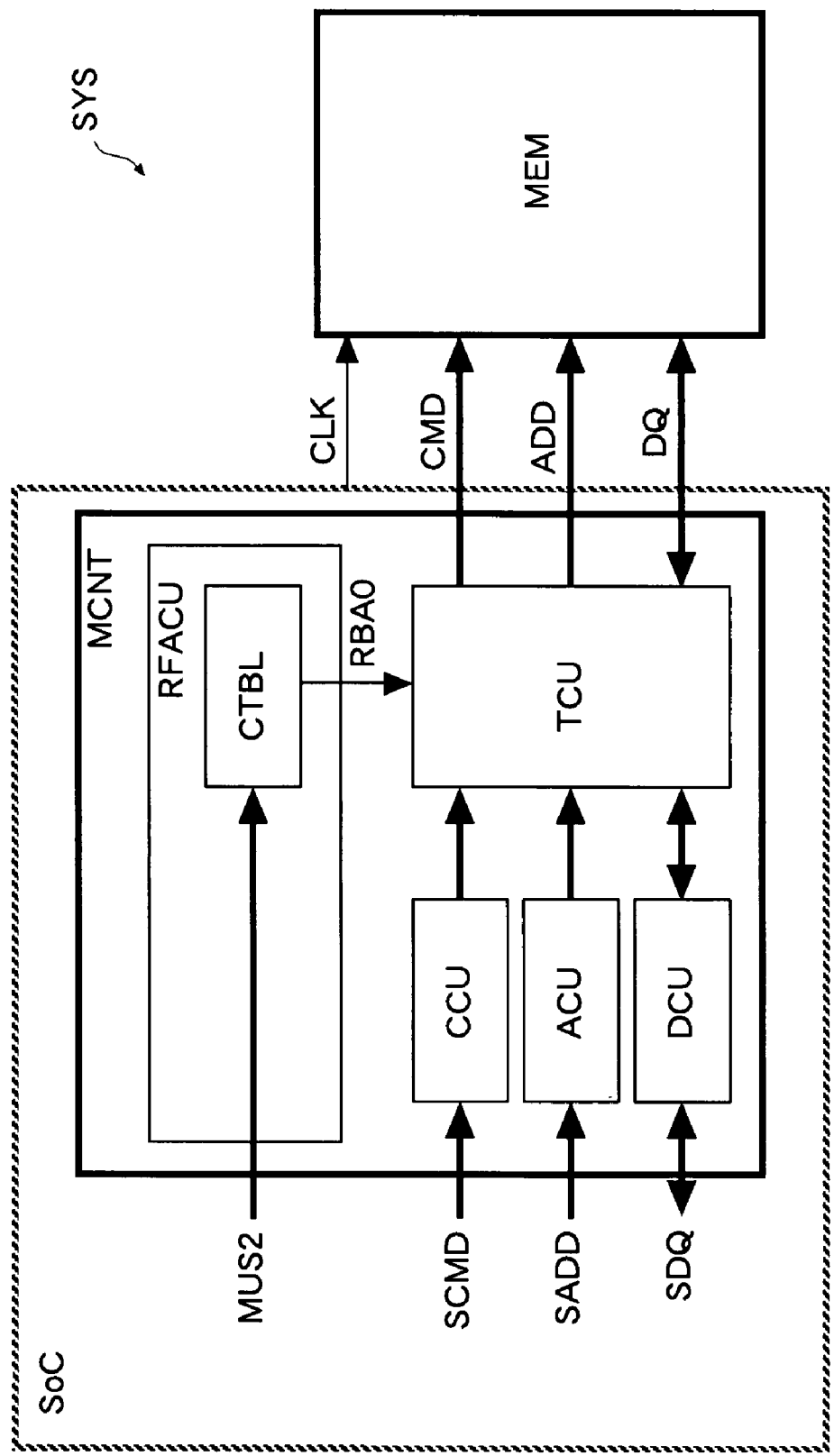
FIG. 21 is a block diagram showing details of a memory controller shown in FIG. 20.

FIG. 21 shows details of the memory controller MCNT shown in FIG. 20. The same elements as those of the first embodiment (FIG. 3) are not described in detail. In this embodiment, the memory controller MCNT is configured such that the external memory area register EMREG is deleted from the refresh area control unit RFACU of the first embodiment. The other configuration is the same as that in FIG. 3. The conversion table CTBL of the refresh area control unit RFACU outputs to the timing control unit TCU a refresh block address signal RBA0 indicating a memory block MBLK corresponding to the use area signal MUS2 received from the CPU.

FIG. 22 shows a refresh area change in the fourth embodiment. A change of the master controllers MA0-5 accessing the memory MEM (operating MA0-5) is the same as that in FIG. 5. Therefore, the use area signal MUS generated by the CPU is the same as that in FIG. 5. Further, the size of a memory area that each of the master controllers MA0-5 uses in the memory MEM is the same as that in FIG. 5. However, the memory blocks MBLK accessed by the memory master controllers MA0-5 can be dynamically changed. For example, according to the operation state of the system SYS, the CPU reserves the memory blocks MBLK in ascending order for the use area of the memory MEM. An address space of each of the memory blocks MBLK0-7 is, for example, 4 k words (000-FFF in hexadecimal).

In this example, the use area signal MUS2 output from the external memory management unit EMMU of the CPU indicates the largest address among addresses of the memory blocks MBLK to be used. When the use area signal MUS2 represents 2FFF in hexadecimal, the conversion table CBL outputs a refresh block address signal RBA representing 07 in hexadecimal in order to enable the refresh operation of the memory blocks MBLK0-2 and disable the refresh operation of the memory blocks MBLK3-7. The timing control unit TCU of the memory controller MCNT outputs the refresh block address signal RBA to the memory MEM in synchronization with an access command.

When the use area signal MUS2 represents 4FFF in hexadecimal, the refresh block address signal RBA representing 1F in hexadecimal is output in order to enable the refresh operation of the memory blocks MBLK0-4 and disable the refresh operation of the memory blocks MBLK5-7. Similarly, when the use area signal MUS2 represents 1FFF in hexadecimal, the refresh block address signal RBA representing 03 in hexadecimal is output in order to enable the refresh operation of the memory blocks MBLK0-1 and disable the refresh operation of the memory blocks MBLK2-7.

The fourth embodiment described above can also provide the same effects as those of the first embodiment previously described. In addition, in this embodiment, it is possible to reduce standby current ISTBY and power consumption without lowering effective efficiency of access operations also in the system SYS in which the use areas that the operating master controllers MA or the CPU use in the memory MEM dynamically change.

Figure 23:
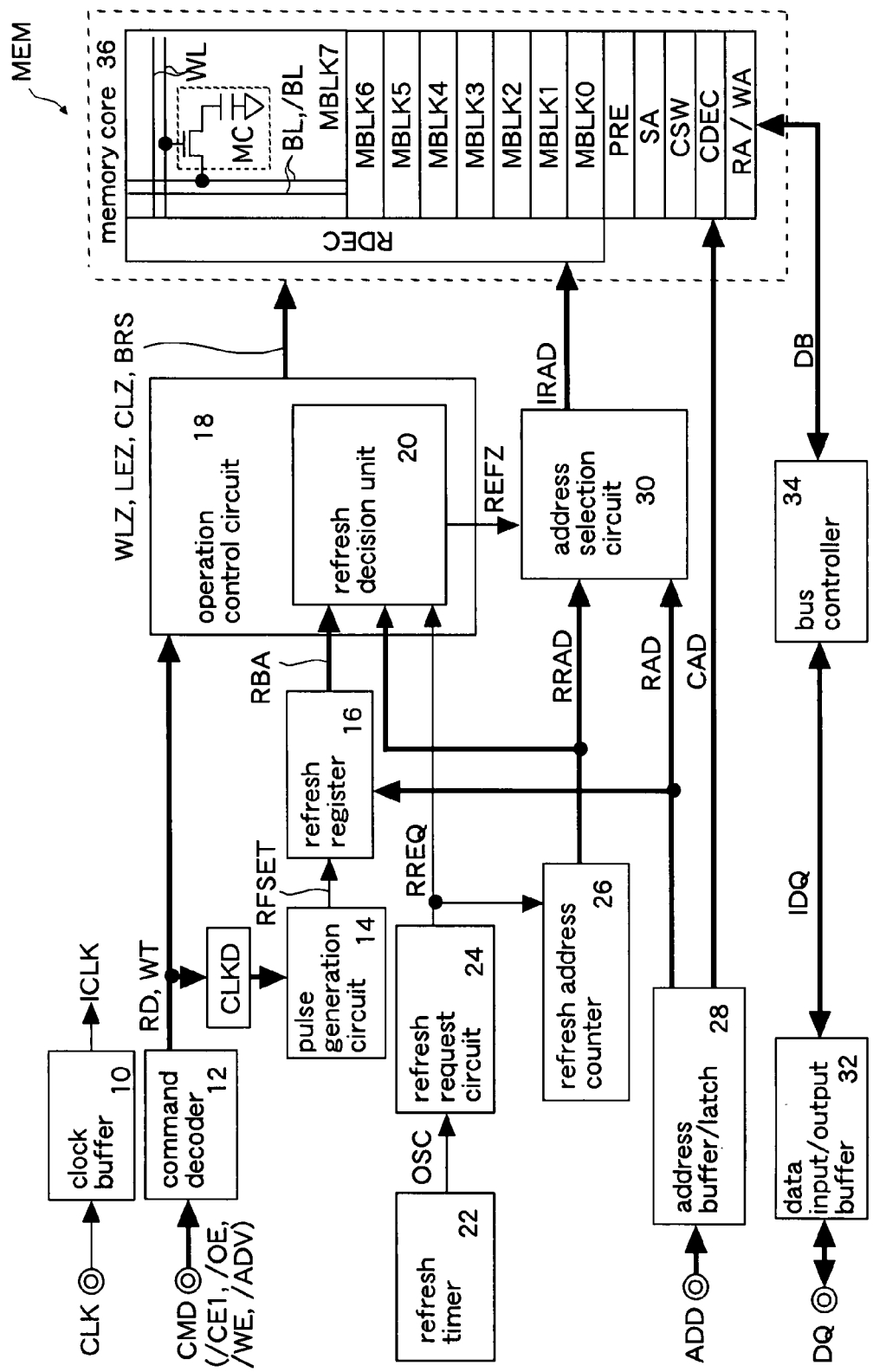
FIG. 23 is a block diagram showing a semiconductor memory of a fifth embodiment.

FIG. 23 shows a semiconductor memory MEM of a fifth embodiment. The same elements as the elements described in the first embodiment will be denoted by the same reference numerals and symbols as those used in the first embodiment, and detailed description thereof will be omitted. In this embodiment, the semiconductor memory MEM is configured such that a delay circuit CLKD is added to the semiconductor memory MEM of the first embodiment. The refresh register 16 receives a row address signal RAD instead of the data signal IDQ. The other configuration is the same as that of the first embodiment. That is, the semiconductor memory MEM is, for example, a clock synchronous type FCRAM operating in synchronization with an external clock CLK. A system SYS and a memory controller MCNT of this embodiment are the same as those of the first embodiment (FIG. 2, FIG. 3).

The delay circuit CLKD delays a read command signal RD or a write command signal WT by one clock cycle to output the delayed command signal to the pulse generation circuit 14. Further, in synchronization with a falling edge of an area set signal RFSET, the refresh register 16 holds a refresh block address signal RBA received by the address buffer/latch 28 and transmitted to the row address signal line RAD, and outputs the held refresh block address signal RBA to the refresh decision unit 20. The delay circuit CLKD, the pulse generation circuit 14, and the address buffer/latch 28 operate as a register control circuit writing disable block information RBA to the refresh register 16 during an access cycle.

Figure 24:
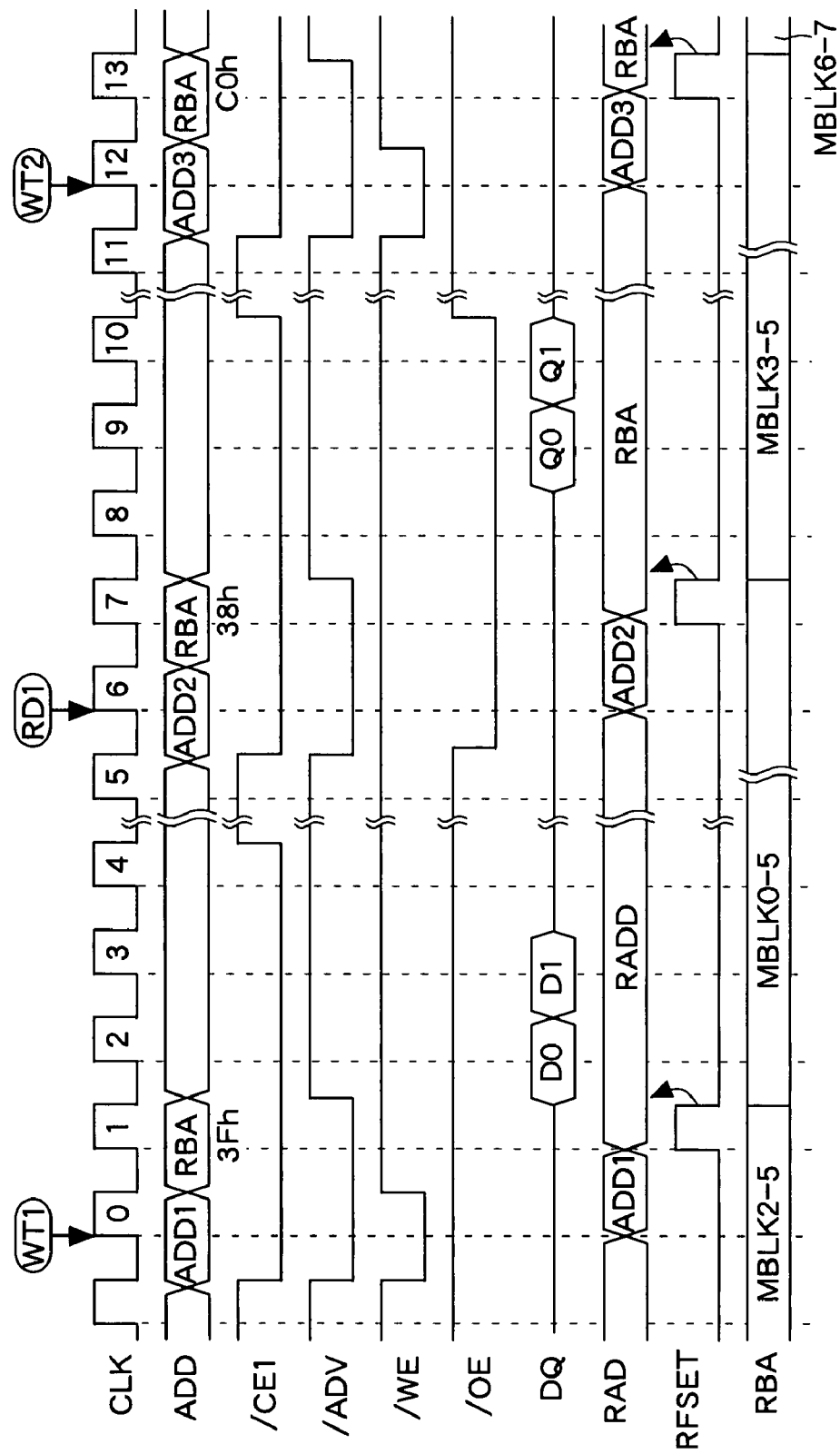
FIG. 24 is a timing chart showing operations of the semiconductor memory of the fifth embodiment.

FIG. 24 shows operations of the semiconductor memory MEM of the fifth embodiment. In this example, the refresh block address signal RBA is supplied via the address terminal ADD at next clock cycle where access commands WT1, RD1, WT2 are received. The area set signal RFSET is generated at next clock cycle where access commands WT1, RD1, RT2 are received. Further, in order to receive the refresh block address signal RBA at the address terminal ADD, an /ADV signal is kept low level until the next clock cycle where access commands W1, RD1, WT2 are received. The other operations are the same as those of the first embodiment (FIG. 4).

The fifth embodiment described above can also provide the same effects as those of the first embodiment previously described. In addition, in this embodiment, by receiving the refresh block address signal RBA via the address terminal ADD, it is possible to reduce the standby current ISTBY without lowing effective efficiency of access operations. Generally, the use frequency of the address terminal ADD is lower than that of the data terminal DQ. In particular, in a memory MEM having a burst operation mode, the use frequency of the address terminal ADD is relatively low. Further, the address terminal ADD is a terminal dedicated for input, and a supply timing of an address signal ADD is independent of an access command. Therefore, it is possible to easily design the semiconductor memory MEM receiving the refresh block address signal RBA during an access operation.

Figure 25:
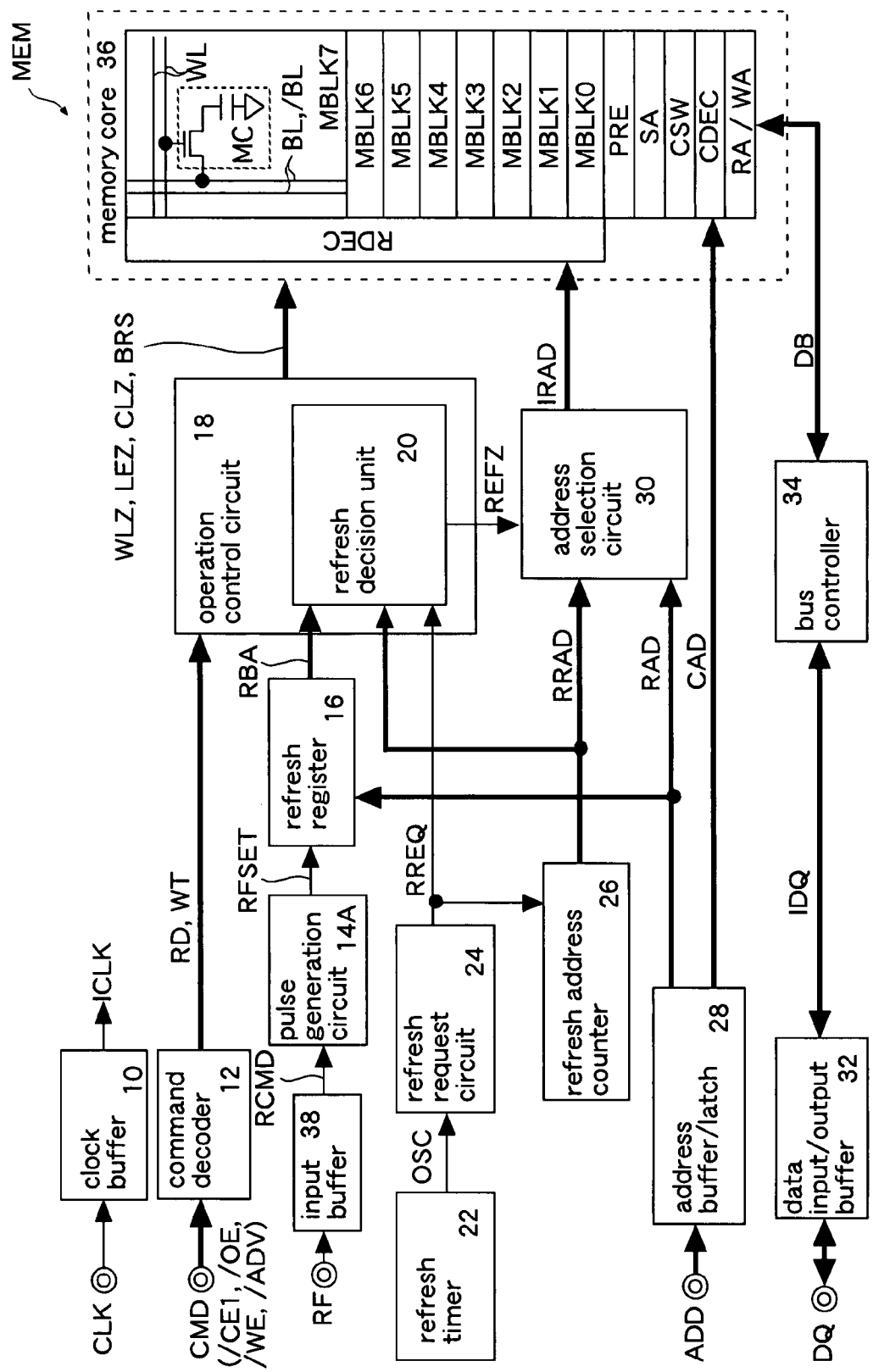
FIG. 25 is a block diagram showing a semiconductor memory of a sixth embodiment.

FIG. 25 shows a semiconductor memory MEM of a sixth embodiment. The same elements as the elements described in the first, third, and fifth embodiments will be denoted by the same reference numerals and symbols as those used in the first, third and fifth embodiments, and detailed description thereof will be omitted.

In this embodiment, the pulse generation circuit 14A of the third embodiment (FIG. 17) is formed in place of the pulse generation circuit 14 of the first embodiment. Further, the memory MEM has the input terminal RF and the input buffer 38 of the third embodiment. As in the fifth embodiment (FIG. 23), the refresh register 16 holds a refresh block address signal RBA received by the address buffer/latch 28 and transmitted to the row address signal line RAD, in synchronization with a falling edge of an area set signal RFSET, and outputs the held refresh block address signal RBA to the refresh decision unit 20. The other configuration is the same as that of the first embodiment. That is, the semiconductor memory MEM is, for example, a clock synchronous type FCRAM operating in synchronization with an external clock CLK. A system SYS and a memory controller MCNT of this embodiment are the same as those of the first embodiment (FIG. 2, FIG. 3). The input buffer 38, the pulse generation circuit 14A, and the address buffer/latch 28 operate as a register control circuit writing disable block information RBA to the refresh register 16 during an access cycle.

Figure 26:
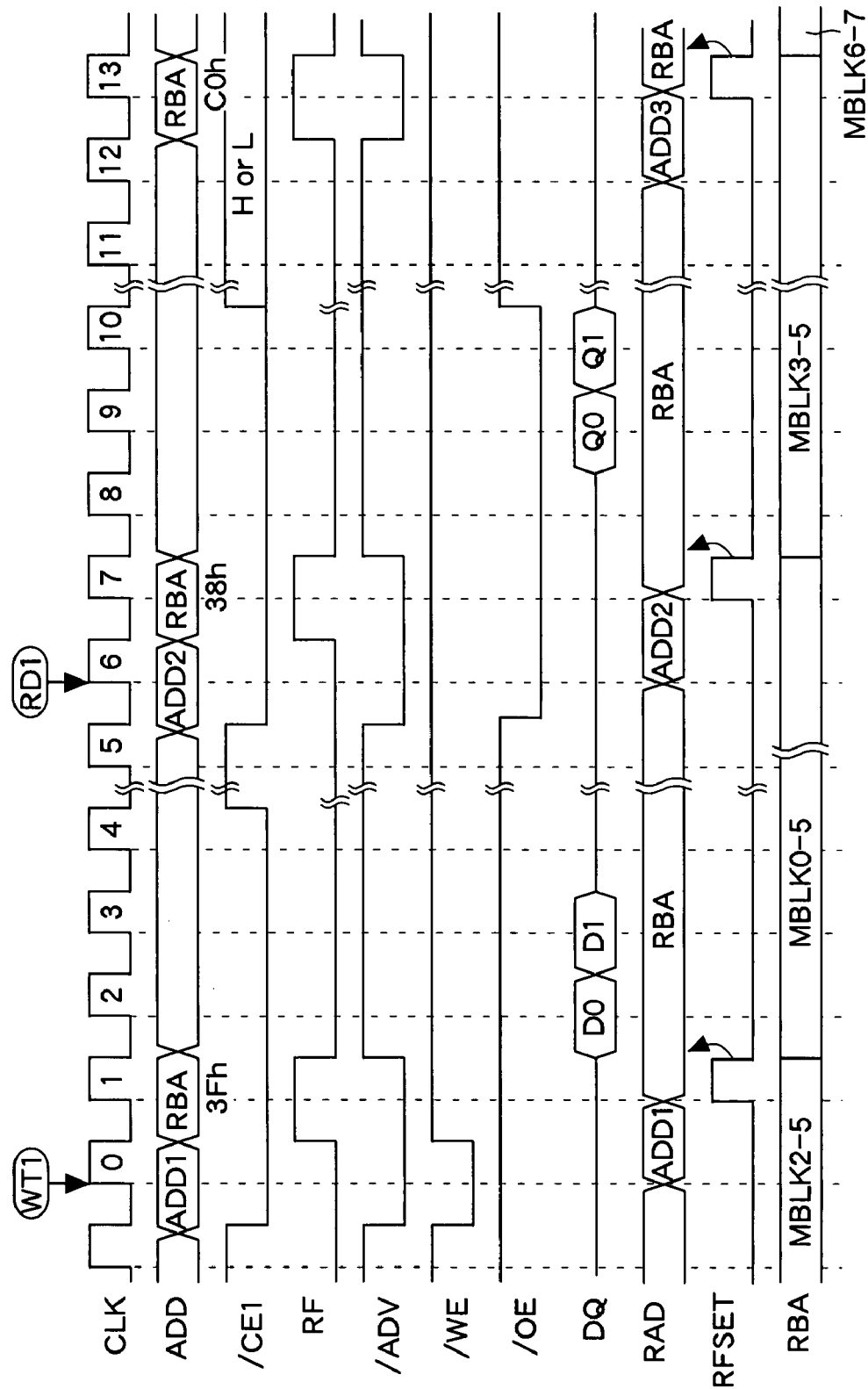
FIG. 26 is a timing chart showing operations of the semiconductor memory of the sixth embodiment.

FIG. 26 shows operations of the semiconductor memory MEM of the sixth embodiment. The operations of this embodiment are the same as those of the third embodiment (FIG. 17) except in that the refresh block address signal RBA is supplied not via the data terminal DQ but via the address terminal ADD. The sixth embodiment described above can also provide the same effects as those of the first, third, and fifth embodiments previously described.

Figure 27:
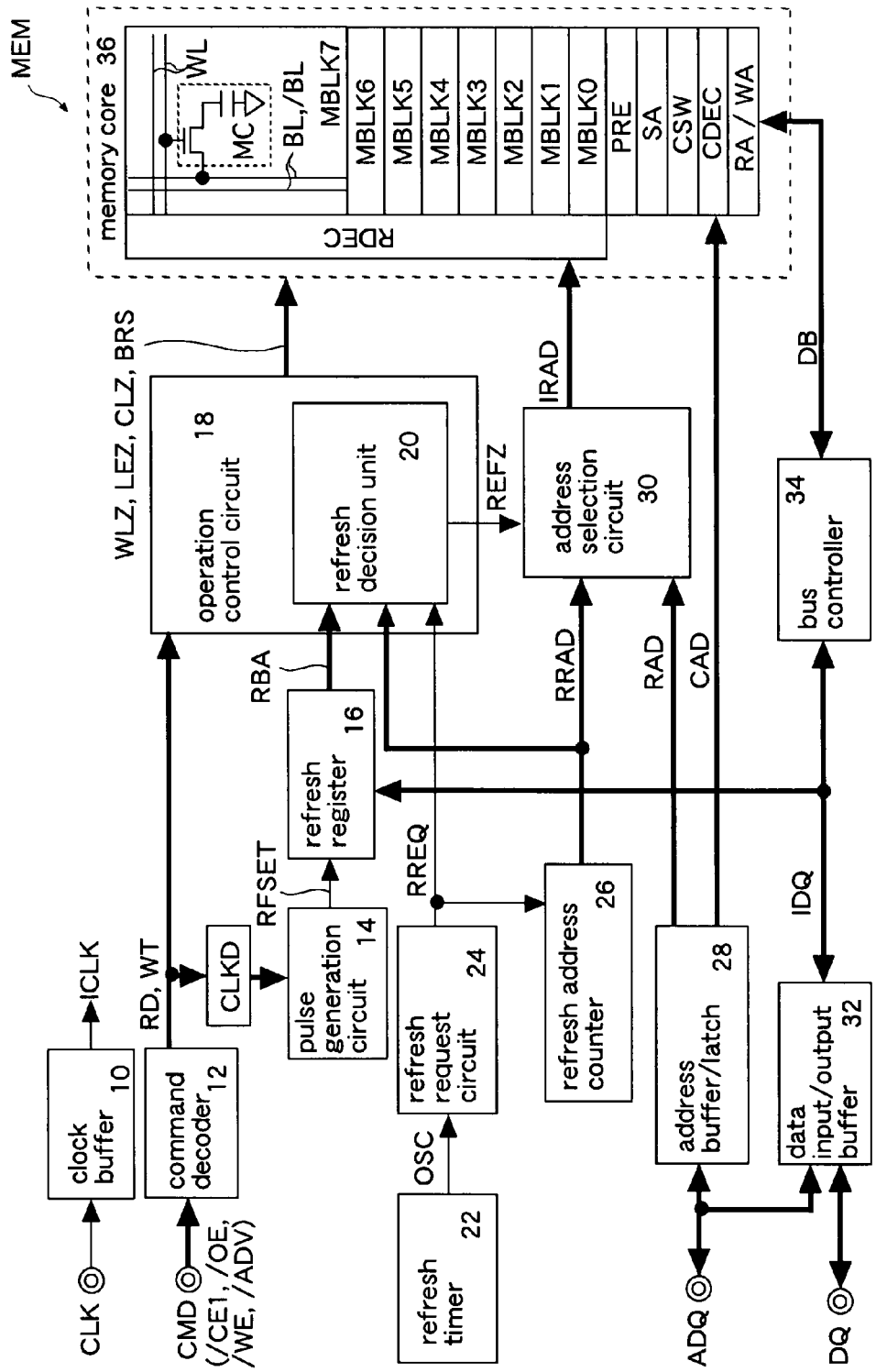
FIG. 27 is a block diagram showing a semiconductor memory of a seventh embodiment.

FIG. 27 shows a semiconductor memory MEM of a seventh embodiment. The same elements as the elements described in the first and fifth embodiments will be denoted by the same reference numerals and symbols as those used in the first and fifth embodiments, and detailed description thereof will be omitted. The memory MEM of this embodiment has an address/data terminal ADQ in place of the address terminal ADD of the first embodiment and has the delay circuit CLKD of the fifth embodiment. In synchronization with an area set signal RFSET, the refresh register 16 holds and outputs a refresh block address signal RBA supplied via the address/data terminal ADQ and the data terminal DQ. The other configuration is the same as that of the first embodiment. That is, the semiconductor memory MEM is, for example, a clock synchronous type FCRAM operating in synchronization with an external clock CLK. A system SYS and a memory controller MCNT of this embodiment are the same as those of the first embodiment (FIG. 2, FIG. 3).

The address/data terminal ADQ is a common terminal for the input of address signal ADD and input and output of data signal DQ. The refresh block address signal RBA is supplied via the address/data terminal ADQ and the data terminal DQ at clock cycle where access commands are received. In synchronization with the area set signal RFSET, the refresh register 16 holds and outputs the refresh block address signal RBA received at the address/data terminal ADQ and the data terminal DQ. The delay circuit CLKD, the pulse generation circuit 14, the address buffer/latch 28, and the data input/output buffer 32 operate as a register control circuit writing disable block information RBA to the refresh register 16 during an access cycle.

Figure 28:
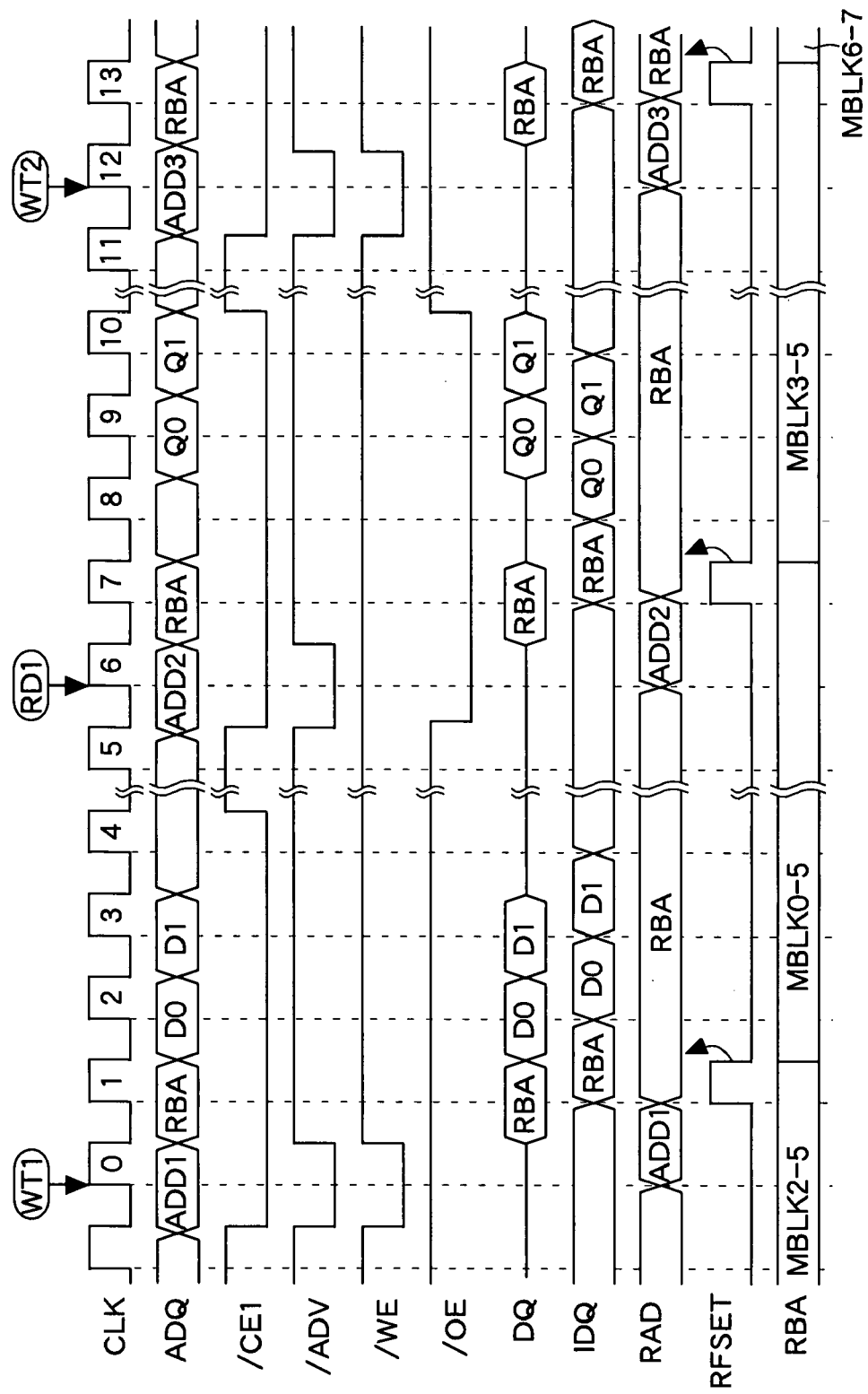
FIG. 28 is a timing chart showing operations of the semiconductor memory of the seventh embodiment.

FIG. 28 shows operations of the semiconductor memory MEM of the seventh embodiment. The operations of this embodiment are the same as those of the fifth embodiment (FIG. 24) except in that the refresh block address signal RBA is supplied via the data terminal DQ and the data signal DQ is supplied via the address/data terminal ADQ. However, since the refresh block address signal RBA received at the address/data terminal ADQ is supplied as a data signal, an /ADV signal is activated to low level only when address signals ADD1, ADD2, ADD3 are received. Incidentally, the refresh block address signal RBA received at the address/data terminal ADQ may be received as an address signal at the address buffer/latch 28. The sixth embodiment described above can also provide the same effects as those of the first and fifth embodiments previously described.

Figure 29:
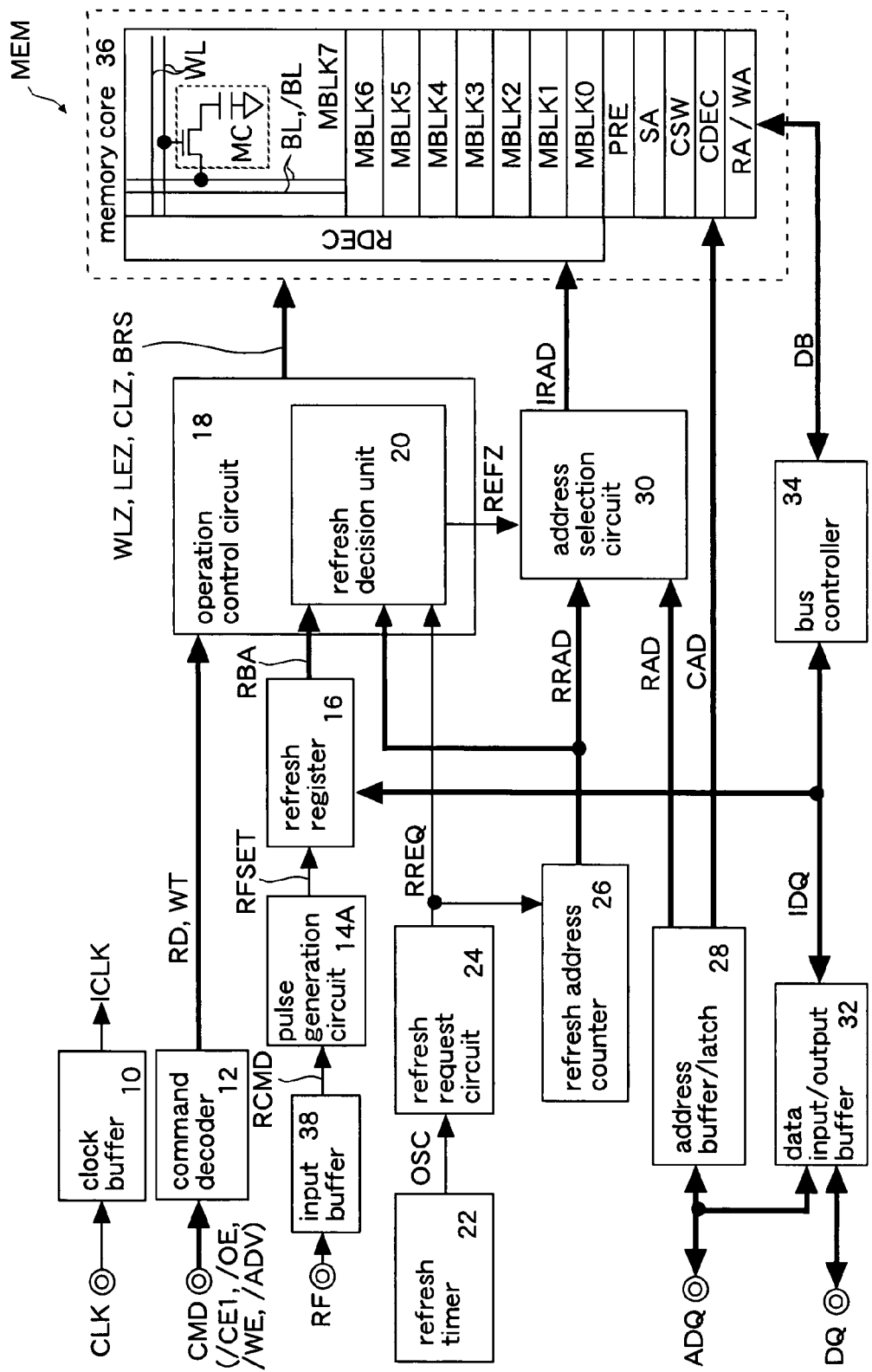
FIG. 29 is a block diagram showing a semiconductor memory of an eighth embodiment.

FIG. 29 shows a semiconductor memory MEM of an eighth embodiment. The same elements as the elements described in the sixth and seventh embodiments will be denoted by the same reference numerals and symbols as those used in the sixth and seventh embodiments, and detailed description thereof will be omitted. The memory MEM of this embodiment has an address/data terminal ADQ in place of the address terminal ADD of the sixth embodiment. In synchronization with an area set signal RFSET, the refresh register 16 holds and outputs a refresh block address signal RBA supplied via the address/data terminal ADQ and the data terminal DQ. The other configuration is the same as that of the sixth embodiment. That is, the semiconductor memory MEM is, for example, a clock synchronous type FCRAM operating in synchronization with an external clock CLK. A system SYS and a memory controller MCNT of this embodiment are the same as those of the first embodiment (FIG. 2, FIG. 3). The input buffer 14, the pulse generation circuit 14A, the address buffer/latch 28, and the data input/output buffer 32 operate as a register control circuit writing disable block information RBA to the refresh register 16 during an access cycle.

Figure 30:
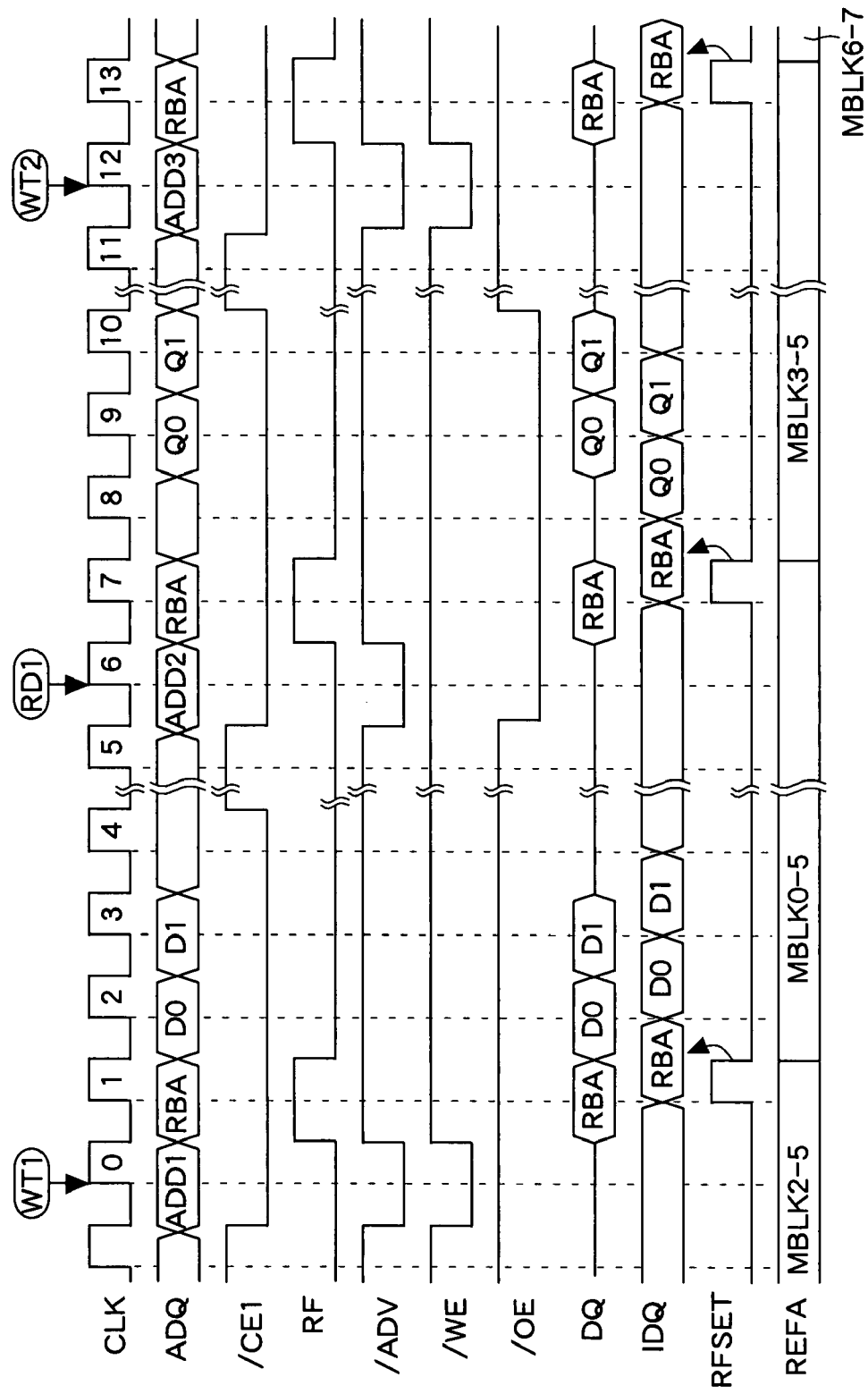
FIG. 30 is a timing chart showing operations of the semiconductor memory of the eighth embodiment.

FIG. 30 shows operations of the semiconductor memory MEM of the eighth embodiment. The operations of this embodiment are the same as those of the fifth embodiment (FIG. 24) except in that the refresh block address signal RBA is supplied via the data terminal DQ and a data signal DQ is supplied via the address/data terminal ADQ. However, since the refresh block address signal RBA received at the address/data terminal ADQ is supplied as a data signal, an /ADV signal is activated to low level only when address signals ADD1, ADD2, ADD3 are received. Incidentally, the refresh block address signal RBA received at the address terminal ADQ may be received as an address signal at the address buffer/latch 28. The eighth embodiment described above can also provide the same effects as those of the first, third, sixth, and seventh embodiments previously described.

Figure 31:
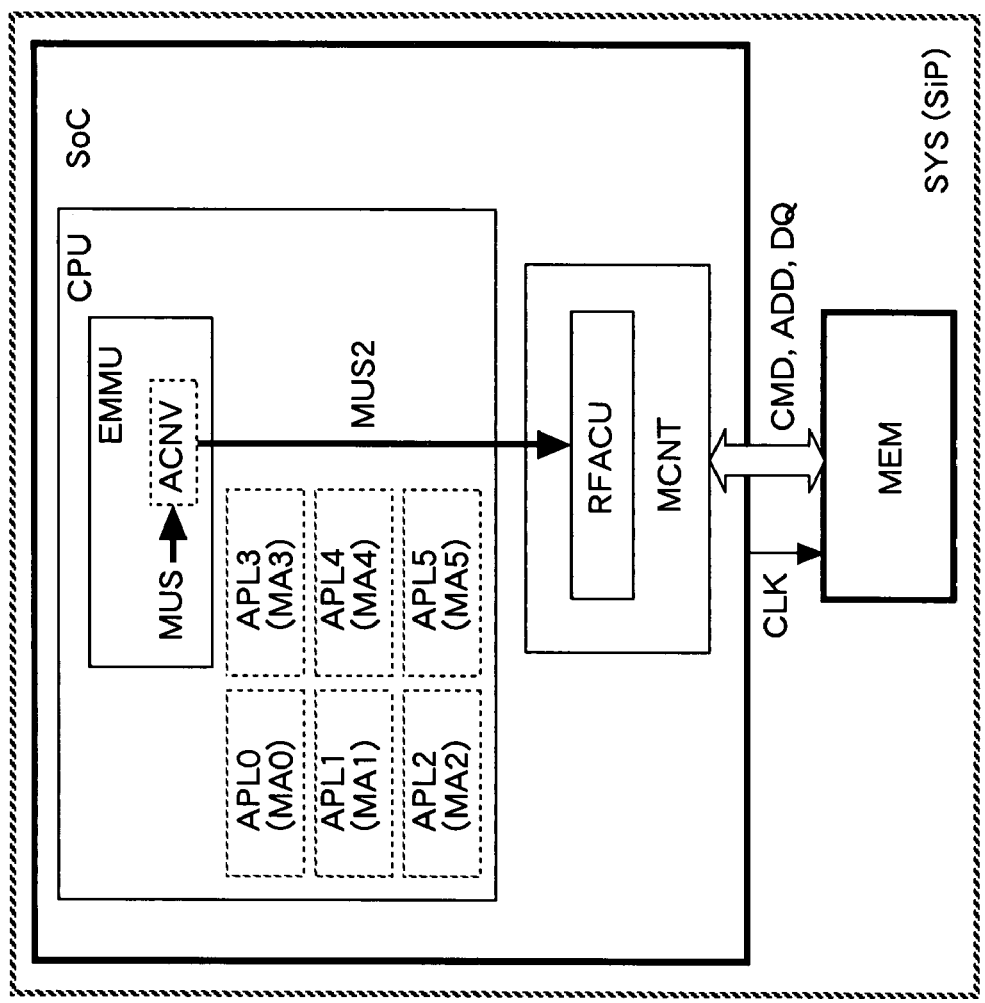
FIG. 31 is a block diagram showing a system of a ninth embodiment.

FIG. 31 shows a system SYS of a ninth embodiment. The same elements as those of the first embodiment (FIG. 2) will not be described in detail. In this embodiment, functions realized by the master controllers MA0-5 shown in FIG. 20 are realized by pieces of application software APL0-5. For example, each piece of the application software APL0-5 has a processing function of a DSP, a data processing function of a MPEG, a data coding function, a communication function, or the like. The pieces of application software APL0-5 are stored in the memory MEM as programs. In the memory MEM, work data and so on necessary for the execution of the application software APL0-5 may be stored. The functions of the application software APL0-5 are realized by the CPU executing the programs. Incidentally, the programs may be stored in a not-shown internal memory provided in the CPU. In this case, the memory MEM functions as a buffer memory storing the work data necessary for the execution of the application software APL0-5.

The memory blocks MBLK used by the application software APL0-5 are decided by the CPU according to operation states of the application software APL0-5. That is, use areas of the memory MEM are set dynamically by software. Therefore, the CPU has an external memory management unit EMMU instead of the master control unit MACU in FIG. 2.

The external memory management unit EMMU converts a use area signal MUS indicating virtual addresses or logical addresses used by the software to a use area signal MUS2 indicating physical addresses of the memory blocks MBLK. On the SoC, there is a signal line MUS2 dedicated for transmitting the use area signal MUS2 from the CPU to the refresh area control unit RFACU of the memory controller MCNT. Incidentally, the use area signal MUS2 may be transmitted during a period in which no address signal or no data signal is transmitted, by utilizing an internal address bus or an internal data bus wired between the CPU and the memory controller MCNT. The other configuration of the system SYS is the same as that in FIG. 20. The memory MEM shown in FIG. 31 is the same as the memory MEM of the first embodiment.

A refresh area change in the ninth embodiment is the same as that in the fourth embodiment (FIG. 22). However, "H" and "L" of MACT0-5 in FIG. 20 respectively represent the run and stop of the application software APL0-5. The memory blocks MBLK accessed by the application software APL0-5 executed by the CPU are changed dynamically. Concretely, the CPU reserves the memory blocks MBLK in ascending order for the use of memory MEM according to the operation state of the system SYS. An address space of each of the memory blocks MBLK0-7 is, for example, 4 k words (000-FFF in hexadecimal). Incidentally, as in the first embodiment (FIG. 5), the memory area dedicatedly used by each piece of the application software APL0-5 may be decided in advance.

The ninth embodiment described above can also provide the same effects as those of the first and fourth embodiments previously described. In addition, in a case where the functions of the master controllers MA0-5 are realized by software, it is also possible to change the memory area to be refreshed without lowering effective efficiency of access cycles.

The above embodiments have described the examples where the embodiment is applied to the clock synchronous type FCRAM of a pseudo SRAM type. The present invention is not limited to such embodiments. For example, the present invention may be applied to a FCRAM of a SDRAM type or to a SDRAM. Alternatively, the present invention may be applied to a clock asynchronous type FCRAM and a clock asynchronous type DRAM. In a DRAM and a SDRAM, for example, an access command is recognized based on a chip select signal /CS, a row address strobe signal /RAS, a column address strobe signal /CAS, and a write enable signal /WE.

Figure 32:
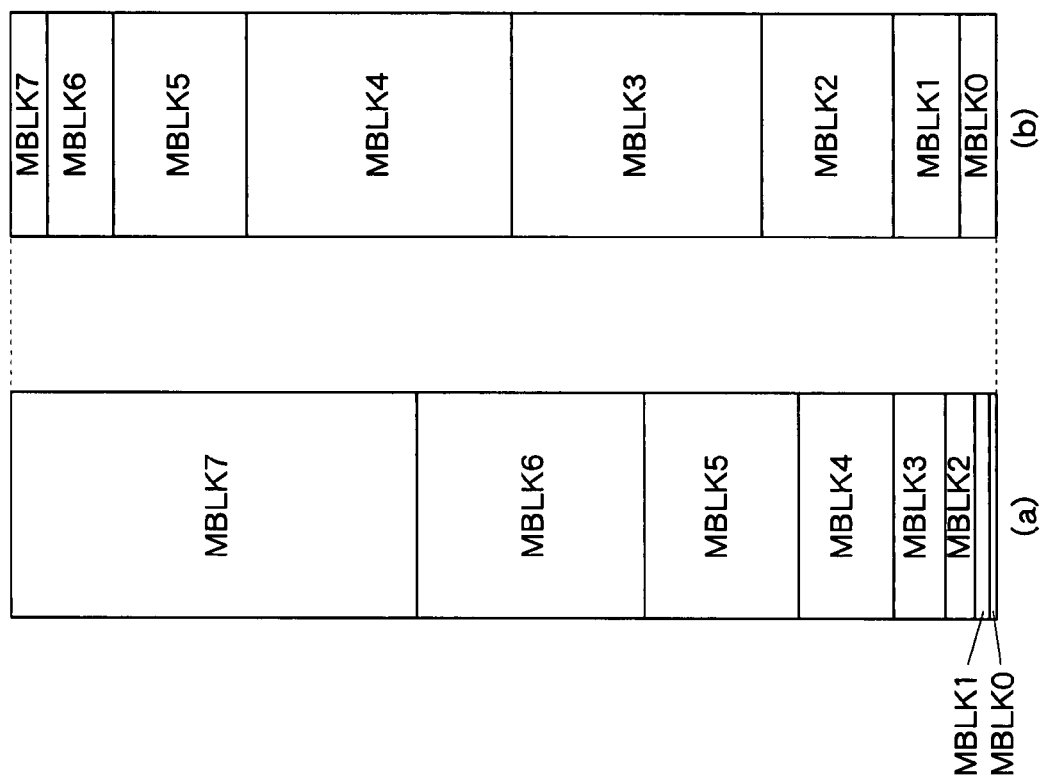
FIG. 32 is an explanatory chart showing other examples of sizes of memory blocks.

The above embodiments have described the examples where the memory capacity of each memory blocks MBLK0-7 assume to be same. The present embodiment is not limited to such embodiments. For example, as shown in (a) in FIG. 32, the memory blocks MBLK0-7 may have memory capacities that are increased in twofold increments from a smaller number side to a larger number side. Alternatively, as shown in (b) in FIG. 32, the memory blocks MBLK0-7 may have memory capacities that become larger from the smaller number side to the larger number side. The uneven allocation of the memory capacity of the memory blocks MBLK0-7 makes it possible to easily allocate the memory blocks MBLK0-7 to the master controllers MA0-5 according to the memory capacity used by the system SYS. Concretely, it is possible to prevent that the memory block MBLK is allocated to the plural master controllers MA as shown in FIG. 5. As a result, the logic of the conversion table CTBL shown in FIG. 3 can be simplified. Further, for example, in a system SYS having smaller-capacity areas that are regularly used and large-capacity areas that are used according to the system operation, the allocation of the memory areas can be optimized. Further, a plurality of methods of allocating the memory areas may be prepared and one of them may be made selectable after the activation according to the setting of the mode register.

The above second embodiment has described the example where the register command signal RCMD is generated by using the chip enable signal CE2 to rewrite the refresh register 16. The rewriting of the refresh register 16 in response to the register command signal RCMD may be applied to the memory MEM of the fifth embodiment (FIG. 23).

The above second and third embodiments have described the examples where the refresh block address signal RBA is supplied via the data terminal DQ. The fifth and sixth embodiments have described the examples where the refresh block address signal RBA is supplied via the address terminal ADD. The present invention is not limited to such embodiments. For example, the refresh block address signal RBA may be supplied by using both the data terminal DQ and the address terminal ADD. Increasing the number of bits of the refresh block address signal RBA is effective when the number of the memory blocks MBLK is large.

The above embodiments have described the examples where the present invention is applied to the SDR-type semiconductor memory receiving an external signal in synchronization with a rising edge of the clock signal CLK. The present invention is not limited to such embodiments. For example, the present invention may be applied to a DDR-type semiconductor memory receiving an external signal in synchronization with both a rising edge and a falling edge of the clock signal CLK.

The above embodiments have described the examples where the disable block information (refresh block address signal RBA) is supplied via the data input/output terminal DQ. The present invention is not limited to such embodiments. For example, in a semiconductor memory having a data input terminal and a data output terminal separately, the disable block information is supplied via the data input terminal.

Further, the semiconductor memory MEM of any of the second-third and fifth-eighth embodiments may be mounted in the system SYS in FIG. 20 and the memory MEM may be accessed by the memory controller MCNT in FIG. 21.

In aforementioned embodiment, a semiconductor memory includes a plurality of memory blocks each having dynamic memory cells, a refresh register, a refresh control circuit, and a register control circuit. The refresh register stores disable block information indicating a memory block whose refresh operation is to be disabled. The refresh control circuit periodically executes the refresh operation of a memory block except the memory block corresponding to the disable block information stored in the refresh register. The register control circuit writes the disable block information to the refresh register in response to an external input, during an access cycle to one of the memory blocks. Therefore it is not necessary to rewrite the refresh register in additional operation cycle. Since there is no need to insert an extra operation cycle, it is possible to change a memory area to be refreshed without lowering effective efficiency of access cycles. As a result, power consumption can be reduced.

For example, a semiconductor memory is mounted in a system together with a memory controller controlling access to the semiconductor memory and at least one master controller accessing the semiconductor memory via the memory controller. In an access cycle to the semiconductor memory, the memory controller outputs the disable block information to a data terminal or an address terminal of the semiconductor memory during a period in which a data signal is not input/output to/from the semiconductor memory or during a period in which an address signal is not output to the semiconductor memory.

It is an aspect of embodiment to change a memory area to be refreshed without deteriorating effective efficiency of access cycles, thereby reducing power consumption.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor memory comprising:
   a plurality of memory blocks each having dynamic memory cells;
   a refresh register storing disable block information indicating a memory block whose refresh operation is to be disabled;
   a refresh control circuit periodically executing the refresh operation of a memory block except the memory block corresponding to the disable block information stored in the refresh register;
   a register control circuit writing the disable block information to the refresh register according to an external input, during an access cycle to one of the memory blocks; and
   a command terminal receiving a register command signal to rewrite the refresh register,
   wherein the register control circuit writes to the refresh register the block disable information in synchronization with the register command signal.

2. The semiconductor memory according to claim 1, further comprising
   a data terminal receiving a data signal to be written to the memory cell or outputting a data signal read from the memory cell,
   wherein the register control circuit writes to the refresh register the block disable information supplied via the data terminal.

3. The semiconductor memory according to claim 1, further comprising an address terminal receiving an address signal indicating a memory cell to be accessed, wherein the register control circuit writes to the refresh register the block disable information supplied via the address terminal during a period in which the address signal is not supplied via the address terminal.

4. The semiconductor memory according to claim 3, further comprising a command terminal receiving a register command signal to rewrite the refresh register, wherein the register control circuit writes to the refresh register the block disable information supplied via the address terminal in synchronization with the register command signal.

5. The semiconductor memory according to claim 3, further comprising a dedicated terminal receiving a dedicated signal to rewrite the refresh register, wherein the register control circuit writes to the refresh register the block disable signal supplied via the address terminal in synchronization with the dedicated signal.

6. The semiconductor memory according to claim 3, wherein: the semiconductor memory receives the address signal and an access command signal to execute the access cycle, in synchronization with a first edge of a clock signal, and the register control circuit writes to the refresh register the block disable information supplied via the address terminal in synchronization with a second edge of the clock signal, the second edge appearing later than the first edge.

7. The semiconductor memory according to claim 1, further comprising:
   a data terminal receiving a data signal to be written to the memory cell or outputting a data signal read from the memory cell; and
   an address terminal receiving an address signal indicating the memory cell to be accessed, wherein:
   the register control circuit outputs an area set signal in response to an access command signal to access the memory cell; and
   the refresh register stores, in synchronization with the area set signal, the block disable information supplied via at least one of the data terminal and the address terminal.

8. The semiconductor memory according to claim 7, further comprising a clock delay circuit delaying the access command signal by a predetermined number of clock cycles, wherein the register control circuit outputs the area set signal in synchronization with the access command signal delayed by the clock delay circuit.

9. A semiconductor memory comprising:
   a plurality of memory blocks each having dynamic memory cells;
   a refresh register storing disable block information indicating a memory block whose refresh operation is to be disabled;
   a refresh control circuit periodically executing the refresh operation of a memory block except the memory block corresponding to the disable block information stored in the refresh register;

a register control circuit writing the disable block information to the refresh register according to an external input, during an access cycle to one of the memory blocks; and a dedicated terminal receiving a dedicated signal to write the refresh register, wherein the register control circuit writes to the refresh register the block disable information supplied via the data terminal in synchronization with the dedicated signal.

10. A semiconductor memory comprising:

a plurality of memory blocks each having dynamic memory cells;

a refresh register storing disable block information indicating a memory block whose refresh operation is to be disabled;

a refresh control circuit periodically executing the refresh operation of a memory block except the memory block corresponding to the disable block information stored in the refresh register; and a register control circuit writing the disable block information to the refresh register according to an external input, during an access cycle to one of the memory blocks, wherein: the semiconductor memory receives an access command signal to execute the access cycle, in synchronization with a first edge of a clock signal, and receiving write data at and outputting read data from the data terminal in synchronization with a second edge of the clock signal, appearing later than the first edge, and the register control circuit writes to the refresh register the block disable information supplied via the data terminal in synchronization with a middle edge existing between the first edge and the second edge or in synchronization with the first edge.

11. A semiconductor memory comprising:

a plurality of memory blocks each having dynamic memory cells;

a refresh register storing disable block information indicating a memory block whose refresh operation is to be disabled;

a refresh control circuit periodically executing the refresh operation of a memory block except the memory block corresponding to the disable block information stored in the refresh register;

a register control circuit writing the disable block information to the refresh register according to an external input, during an access cycle to one of the memory blocks; and an address/data terminal receiving an address signal indicating a memory cell to be accessed and a data signal to be written to the memory cell in common, and outputting a data signal read from the memory cell, wherein the register control circuit writes to the refresh register the block disable information supplied via the address/data terminal during a period in which neither the address signal nor the data signal is transmitted to the address/data terminal.

12. An operating method of a semiconductor memory having a plurality of memory blocks each having dynamic memory cells, the method comprising:

writing the disable block information, indicating a memory block whose refresh operation is to be disabled, to the refresh register according to an external input, during an access cycle to one of the memory blocks;

periodically executing the refresh operation of a memory block except the memory block corresponding to the disable block information stored in the refresh register;

writing the block disable information to the refresh register in synchronization with a register command signal to rewrite the refresh register supplied via a command terminal, in synchronization with a dedicated signal to rewrite the refresh register supplied via a dedicated terminal, or in synchronization with one of a first edge and a middle edge between the first edge and a second edge, the first edge of a clock signal for receiving an access command signal to execute the access cycle, the second edge appearing later than the first edge of the clock signal for receiving write data at and outputting read data from a data terminal.

13. The operating method of the semiconductor memory according to claim 12, further comprising receiving a data signal to be written to the memory cell at a data terminal or outputting, from the data terminal, a data signal read from the memory cell, wherein the block disable information supplied via the data terminal during a period in which the data signal is not transmitted via the data terminal is written to the refresh register.

14. The operating method of the semiconductor memory according to claim 12, further comprising receiving, at an address terminal, an address signal indicating a memory cell to be accessed, wherein the block disable information supplied via the address terminal during a period in which the address signal is not supplied via the address terminal is written to the refresh register.

15. A memory controller controlling an operation of a semiconductor memory, comprising:

an output unit outputting a disable block information via one of a data terminal, and an address terminal of the semiconductor memory during a period in which a data signal is not input/output to/from the semiconductor memory or during a period in which an address signal is not output to the semiconductor memory in an access cycle in which the memory controller accesses the semiconductor memory;

a refresh area control unit generating the disable block information according to a memory area that at least one master controller uses in the semiconductor memory, the master controller accessing the semiconductor memory via the memory controller; and a timing control unit which outputs to the semiconductor memory a command signal, the address signal, and a data signal received from the master controller in order to access the semiconductor memory, and which outputs to the semiconductor memory the disable block information generated by the refresh area control unit, during a period in which the disable block information does not compete with one of the address signal and the data signal output from the master controller.

16. The memory controller according to claim 15, wherein the refresh area control unit comprises an area conversion unit which, according to a use area signal indicating the memory area that the master controller uses in the semiconductor memory, generates the disable block information indicating a memory block except a memory block including the memory area indicated by the use area signal.

17. The memory controller according to claim 16, wherein the refresh area control unit comprises an external memory area register which stores the memory area that each of the master controllers uses in the semiconductor memory and which receives a master selection signal indicating that the master controller uses the semiconductor memory and outputs, as the use area signal, the memory area corresponding to the received master selection signal.

18. A system having a semiconductor memory, a memory controller controlling access to the semiconductor memory and at least one master controller accessing the semiconductor memory via the memory controller, wherein the semiconductor memory comprises:
a plurality of memory blocks each having dynamic memory cells;
a refresh register storing disable block information indicating a memory block whose refresh operation is to be disabled;
a refresh control circuit periodically executing the refresh operation of a memory block except the memory block corresponding to the disable block information stored in the refresh register; and
a register control circuit writing the disable block information to the refresh register according to an external input,
wherein the control circuit writes the block disable information to the refresh register in synchronization with a register command signal to rewrite the refresh register supplied via a command terminal, in synchronization with a dedicated signal to rewrite the refresh register supplied via a dedicated terminal, or in synchronization with one of a first edge and a middle edge between the first edge and a second edge, the first edge of a clock signal for receiving an access command signal to execute the access cycle, the second edge appearing later than the first edge of the clock signal for receiving write data at and outputting read data from a data terminal.

* * * * *